United States Patent [19]
Araki et al.

[11] Patent Number: 5,968,676
[45] Date of Patent: Oct. 19, 1999

[54] MAGNETORESISTANCE EFFECT FILM AND MAGNETORESISTANCE EFFECT TYPE HEAD

[75] Inventors: Satoru Araki, Chiba; Kiyoshi Noguchi, Saku, both of Japan

[73] Assignee: TDK Corporation, Tokyo, Japan

[21] Appl. No.: 08/993,019

[22] Filed: Dec. 18, 1997

[30] Foreign Application Priority Data

Jun. 5, 1997 [JP] Japan .................................. 9-163262

[51] Int. Cl.[6] .................................................. G11B 5/66
[52] U.S. Cl. .............. 428/692; 428/694 R; 428/694 TR; 428/694 T; 428/694 TS; 428/694 TM; 428/900; 360/113; 324/252; 204/192.2
[58] Field of Search .................. 428/694 R, 694 TR, 428/692, 694 T, 694 TS, 694 TM, 900; 324/252; 360/113; 204/192.2

[56] References Cited

U.S. PATENT DOCUMENTS 5,549,978  8/1996  Iwasaki .................................. 428/692

FOREIGN PATENT DOCUMENTS 8-63715  8/1996  Japan .

OTHER PUBLICATIONS

V.S. Speriosu, et al., "Magnetic thin films in recording technology", IBM J. Res. Develop., Nov. 1990, vol. 34 No. 6, pp. 884–902.

Susumu Soeya, et al., "Distribution of blocking temperature in bilayered $Ni_{81}Fe_{19}$/NiO films", J. Appl. Phys. 76 (9), Nov. 1, 1994, pp. 5356–5360.

*Primary Examiner*—Leszek Kiliman
*Attorney, Agent, or Firm*—Oblon, Spivak, McClelland, Maier & Neustadt, P.C.

[57] ABSTRACT

A spin valve type magnetoresistance effect film comprises a magnetic multilayered film including a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer. The antiferromagnetic layer contains oxygen as impurities and a concentration of oxygen contained in the antiferromagnetic layer is set to 1 to 2,000 atomic ppm. With this arrangement, there can be provided a magnetoresistance effect film having a high-quality antiferromagnetic layer which is excellent in thermal stability, sufficiently high in blocking temperature and highly excellent in pinning effect. Further, there can be provided a magnetoresistance effect type head which is excellent in thermal stability, high in magnetic field sensitivity and large in MR change ratio.

25 Claims, 14 Drawing Sheets

MAGNETORESISTANCE EFFECT FILM AND MAGNETORESISTANCE EFFECT TYPE HEAD

BACKGROUND OF THE INVENTION

1. Field of the Invention

The present invention relates to a magnetoresistance effect film for reading the magnetic field intensity of a magnetic recording medium or the like as a signal and, in particular, to a magnetoresistance effect film which is capable of reading a small magnetic field change as a greater electrical resistance change signal, and further relates to a magnetoresistance effect type head using such a magnetoresistance effect film.

2. Description of the Prior Art

Recently, there has been the development for increasing the sensitivity of magnetic sensors and increasing the density in magnetic recording and, following this, magnetoresistance effect type magnetic sensors (hereinafter referred to as MR sensors) and magnetoresistance effect type magnetic heads (hereinafter referred to as MR heads) using magnetoresistance change have been actively developed. Both MR sensors and MR heads are designed to read out external magnetic field signals on the basis of the variation in resistance of a reading sensor portion formed of magnetic material. The MR sensors have an advantage that a high sensitivity can be obtained and the MR heads have an advantage that a high output can be obtained upon reading out signals magnetically recorded in high density because the reproduced output does not depend on the relative speed of the sensors or heads to the recording medium.

However, conventional MR sensors which are formed of magnetic materials such as $Ni_{80}Fe_{20}$ (Permalloy), NiCo or the like have a small resistance change ratio $\Delta R/R$ which is about 1 to 3% at maximum, and thus these materials have insufficient sensitivity as the reading MR head materials for ultrahigh density recording of the order of several GBPSI (Giga Bits Per Square Inches) or more.

Attention has been recently paid to artificial lattices having the structure in which thin films of metal having a thickness of an atomic diameter order are periodically stacked, because their behavior is different from that of bulk metal. One of such artificial lattices is a magnetic multilayered film having ferromagnetic metal thin films and non-magnetic metal thin films alternately deposited on a substrate. Heretofore, magnetic multilayered films of an iron-chromium type, a cobalt-copper type and the like have been known. However, these artificial lattice magnetic multilayered films are not commercially applicable as they are because the external magnetic field at which a maximum resistance change occurs (operating magnetic field intensity), is as high as several tens of kilo-oersted.

Under these circumstances, a new structure which is called a spin valve has been proposed. In this structure, two NiFe layers are formed via a non-magnetic metal layer, and an FeMn layer is further formed so as to be adjacent to one of the NiFe layers.

In this case, since the FeMn layer and the NiFe layer adjacent thereto are directly exchange-coupled to each other, the direction of the magnetic spin of this NiFe layer is fixed in the range of several tens to several hundreds Oe in magnetic field intensity. On the other hand, the direction of the magnetic spin of the other NiFe layer is freely changeable by an external magnetic field. As a result, there can be achieved a magnetoresistance change ratio (MR change ratio) of 2 to 5% in a small magnetic field range which corresponds to the degree of coercive force of the NiFe layer.

In the spin valve, by realizing a difference in relative angles of spins between two magnetic layers, the large MR change which differs from the conventional anisotropy magnetoresistance (AMR) effect is accomplished. This is realized by pinning of the magnetic layer spin due to the direct exchange coupling force between one of the magnetic layers and the antiferromagnetic layer. This exchange coupling can be said to be the substance of the spin valve.

However, for putting the spin valve to practical use, there are various problems as described hereinbelow. The strength of the exchange coupling pinning the magnetic layer is represented by a magnitude of a unidirectional anisotropy magnetic field Hua which shifts. On the other hand, a temperature at which Hua is lost is set to be a blocking temperature Tb which represents a thermal stability. The generally used FeMn layers and other antiferromagnetic layers have the following problems with respect to the exchange coupling:

(1) The blocking temperature Tb is low, that is, in the range from 150 to 170° C. As compared with the state of the bulk, the blocking temperature Tb is low so that an excellent thin film which can fully achieve an expected pinning effect can not be obtained.

(2) Dispersion of the blocking temperatures Tb occurs. Specifically, because of a thin film, the film surface of the FeMn layer is composed of various crystal grains, and the individual crystal grains have their own blocking temperatures Tb. If all the crystal grains have the same blocking temperature Tb, no problem is raised. However, actually, some crystal grains have lower blocking temperatures Tb, while some crystal grains have higher blocking temperatures Tb. As a result, it is possible that there exist those grains with small exchange coupling which causes reversal of the spin in the ferromagnetic layer at 80 to 120° C. representing an operating temperature range on application (due to existence of crystal grains having lower blocking temperatures Tb). Then, the spin direction of the pinned ferromagnetic layer may be inclined as a whole so that the output voltage is lowered. Thus, it is desired that a high-quality antiferromagnetic thin film be provided wherein as many crystal grains as possible have the same high blocking temperature Tb.

Therefore, it is an object of the present invention to provide a high-quality antiferromagnetic thin film (antiferromagnetic layer) which is excellent in thermal stability, free from deterioration of Hua, sufficiently high in blocking temperature and small in blocking temperature dispersion degree, and a magnetoresistance effect type head having a magnetic multilayered film which is excellent in thermal stability, high in magnetic field sensitivity and large in MR change ratio. As a technique similar to the present invention, Japanese First (unexamined) Patent Publication No. 8-63715 discloses that the oxygen concentration of the antiferromagnetic layer is set to be no more than 10 atomic %, and it may be seen from a graph of an embodiment that the oxygen concentration of about 6 atomic % is shown. However, the operation and effect of the present invention are not realized in such a high oxygen concentration range. Accordingly, the present invention is distinguishable over the technique of Japanese First Patent Publication No. 8-63715. Particularly, Japanese First Patent Publication No. 8-63715 describes that Hua is extremely reduced due to oxidation of the antiferromagnetic layer. The present invention is based on the findings that impurities on the ppm or ppb level induce a microscopic structural change and a change in crystal property of the layer, and pays attention to the impurities on the ppm or ppb level and not the at% level. Further, the technique of Japanese First Patent Publication No. 8-63715 does not relate to the spin valve film, and thus differs from the basic structure of the present invention.

SUMMARY OF THE INVENTION

For solving the foregoing problems, according to one aspect of the present invention, there is provided a spin valve type magnetoresistance effect film comprising a magnetic multilayered film including a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer, wherein the antiferromagnetic layer contains oxygen as impurities and a concentration of oxygen contained in the antiferromagnetic layer is set to 1 to 2,000 atomic ppm.

According to another aspect of the present invention, there is provided a spin valve type magnetoresistance effect film comprising a magnetic multilayered film including a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer, wherein the antiferromagnetic layer contains oxygen as impurities and a concentration of oxygen contained in the antiferromagnetic layer is set to 1 to 2,000 atomic ppm, and wherein the soft magnetic layer contains oxygen as impurities and a concentration of oxygen contained in the soft magnetic layer is set to 1 to 800 atomic ppm.

According to another aspect of the present invention, there is provided a magnetoresistance effect type head comprising a magnetoresistance effect film, conductive films and electrode portions, wherein the conductive films are conductively connected to the magnetoresistance effect film through the electrode portions, and the magnetoresistance effect film is a spin valve type magnetoresistance effect film which comprises a magnetic multilayered film including a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer, and wherein the antiferromagnetic layer contains oxygen as impurities and a concentration of oxygen contained in the antiferromagnetic layer is set to 1 to 2,000 atomic ppm.

According to another aspect of the present invention, there is provided a magnetoresistance effect type head comprising a magnetoresistance effect film, conductive films and electrode portions, wherein the conductive films are conductively connected to the magnetoresistance effect film through the electrode portions, and the magnetoresistance effect film is a spin valve type magnetoresistance effect film which comprises a magnetic multilayered film including a non-magnetic metal layer, a ferromagnetic layer formed on one surface of the non-magnetic metal layer, a soft magnetic layer formed on the other surface of the non-magnetic metal layer, and an antiferromagnetic layer which is formed on a surface of the ferromagnetic layer remote from a surface thereof abutting the non-magnetic metal layer so as to pin a direction of magnetization of the ferromagnetic layer, wherein the antiferromagnetic layer contains oxygen as impurities and a concentration of oxygen contained in the antiferromagnetic layer is set to 1 to 2,000 atomic ppm, and wherein the soft magnetic layer contains oxygen as impurities and a concentration of oxygen contained in the soft magnetic layer is set to 1 to 800 atomic ppm.

It may be arranged that the antiferromagnetic layer further contains at least one selected from carbon, sulfur and chlorine as impurities, and the total concentration of the impurities including at least the one of carbon, sulfur and chlorine is set to 1 to 1,000 atomic ppm.

It may be arranged that the antiferromagnetic layer further contains at least one selected from carbon, sulfur and chlorine as impurities, and the total concentration of the impurities including at least the one of carbon, sulfur and chlorine is set to 1 to 1,000 atomic ppm, and that the soft magnetic layer further contains at least one selected from carbon, sulfur and chlorine as impurities, and the total concentration of the impurities including at least the one of carbon, sulfur and chlorine contained in the soft magnetic layer is set to 1 to 500 atomic ppm.

DETAILED DESCRIPTION OF THE INVENTION

Hereinbelow, the concrete structures of the present invention will be described in detail. Throughout the specification, ppm and ppb, which are the units representing the concentration, represent atomic ppm and atomic ppb.

Figure 1:
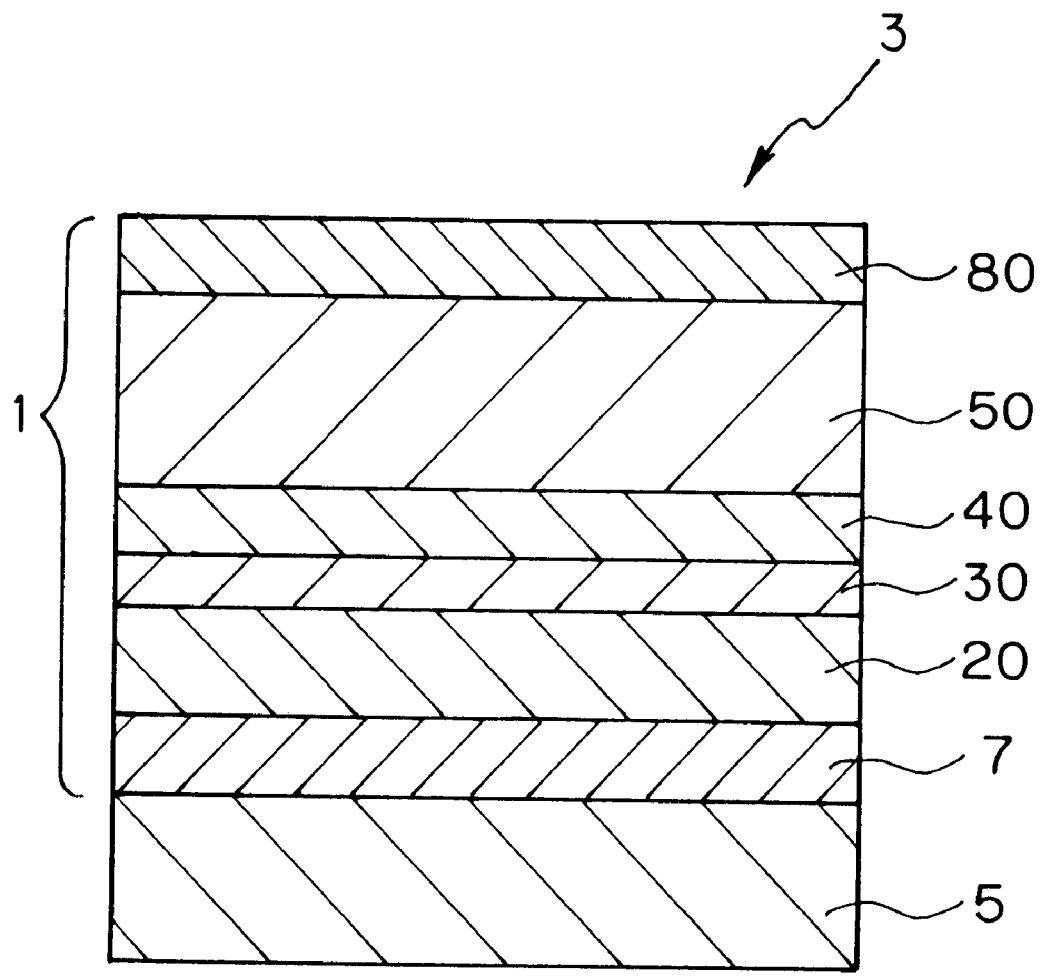
FIG. 1 is a sectional view showing a magnetoresistance effect film according to the present invention.

FIG. 1 is a sectional view showing a magnetoresistance effect film 3 according to a preferred embodiment of the present invention. The magnetoresistance effect film 3 has a magnetic multilayered film 1 as a spin valve film showing a giant magnetoresistance effect.

As shown in FIG. 1, the magnetic multilayered film 1 has a laminate body structure which comprises a non-magnetic metal layer 30, a ferromagnetic layer 40 formed on one surface of the non-magnetic metal layer 30, a soft magnetic layer 20 formed on the other surface of the non-magnetic metal layer 30, and an antiferromagnetic layer 50 which is formed on a surface of the ferromagnetic layer 40 remote from the other surface thereof abutting the non-magnetic metal layer 30 so as to pin the direction of magnetization of the ferromagnetic layer 40.

As shown in FIG. 1, the laminate body is normally formed on a substrate 5, and they are laminated from the side of the substrate 5 via a ground layer 7 in the order of the soft magnetic layer 20, the non-magnetic metal layer 30, the ferromagnetic layer 40 and the antiferromagnetic layer 50. As shown in the drawing, a protective layer 80 is formed on the antiferromagnetic layer 50 for preventing oxidation.

In the magnetic multilayered film 1 (spin valve film) according to this embodiment, it is required that the soft magnetic layer 20 and the ferromagnetic layer 40 which are adjacently formed at both sides of the non-magnetic metal layer 30 have substantially different magnetization directions from each other in accordance with a signal magnetic field applied from the external. The reason is as follows: In the principle of the present invention, when the magnetization directions of the soft magnetic layer 20 and the ferromagnetic layer 40 which are formed via the non-magnetic metal layer 30 interposed therebetween are deviated from each other, conduction electrons have a behavior of scattering due to spins to increase its resistance. In this case, when the magnetization directions are opposite to each other, the maximum resistance is obtained. That is, in this invention, when a signal magnetic field from the external is positive (in an upward direction with respect to a recording surface 93 of a recording medium 90 (represented by reference numeral 92)) as shown in FIG. 2, there occur mutually opposite components in the magnetization directions of the neighboring magnetic layers so that the resistance is increased.

Here, the relationship among the external signal magnetic field from the magnetic recording medium, the magnetization directions of the soft magnetic layer 20 and the ferromagnetic layer 40 and the variation of electrical resistance in the (spin valve) magnetic multilayered film used in the magnetoresistance effect film of the present invention will be described.

Now, in order to facilitate the understanding of the present invention, the simplest magnetic multilayered film in which the pair of soft magnetic layer 20 and ferromagnetic layer 40 exist via the non-magnetic metal layer 30 as shown in FIG. 1 will be described with reference to FIG. 2.

Figure 2:
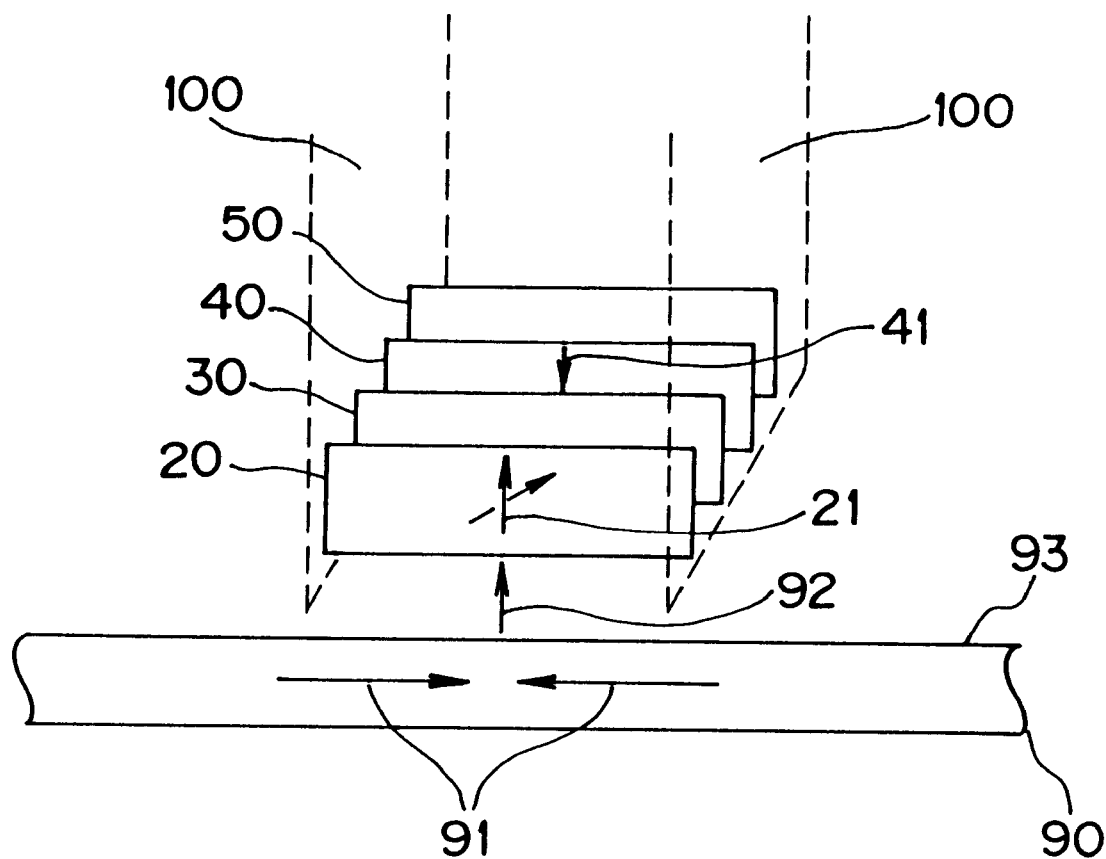
FIG. 2 is a schematic diagram showing a magnetoresistance effect film, particularly, a structure of a magnetic multilayered film, for explaining an operation of the present invention.

As shown in FIG. 2, the magnetization of the ferromagnetic layer 40 is pinned in a downward direction to the surface of the recording medium by a method as described later (see reference numeral 41). The soft magnetic layer 20 is formed via the non-magnetic metal layer 30 so that the magnetization direction thereof is varied in accordance with the signal magnetic field from the external (see reference numeral 21). At this time, the relative angle between the magnetization directions of the soft magnetic layer 20 and the ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (Magneto-Resistance) effect, which essentially differs in mechanism from the anisotropic magnetoresistance effect of Permalloy, can be obtained. This is particularly called a GMR (Giant-Magneto-Resistance) effect.

Figure 3:
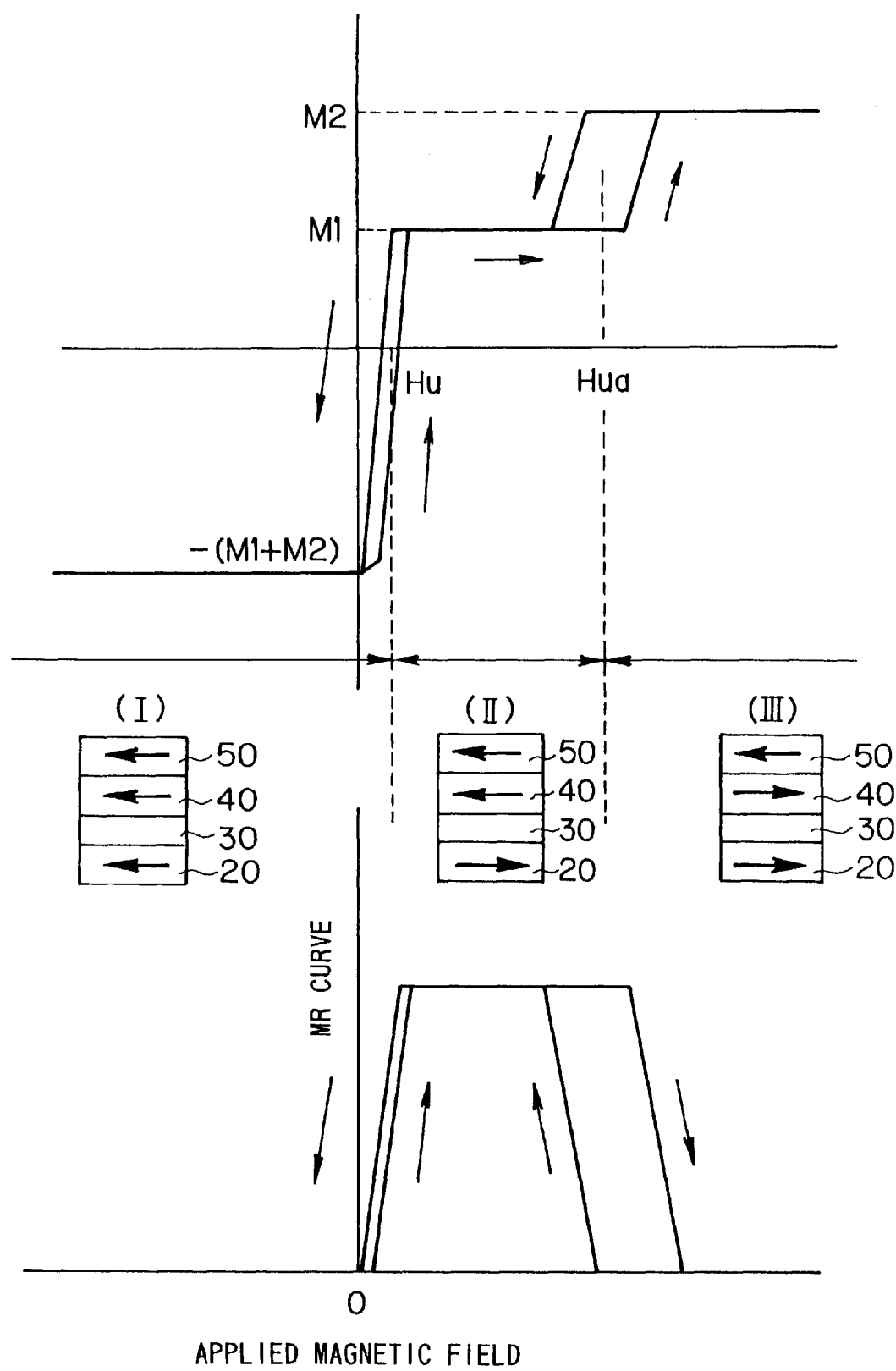
FIG. 3 is a schematic diagram showing a magnetization curve and an MR curve for explaining an operation of the present invention.

The magnetization directions of the soft magnetic layer 20, the ferromagnetic layer 40 and the antiferromagnetic layer 50 exhibiting a pinning effect are varied relative to the external magnetic field. The variation of the magnetization directions thereof is shown in FIG. 3 in correspondence with the magnetization curve and the MR curve. In this case, all the magnetization of the ferromagnetic layer 40 is fixed in a minus direction (in a downward direction with respect to the recording surface of the recording medium 90). When the external signal magnetic field is minus, the magnetization of the soft magnetic layer 20 is in the minus direction. Now, it is assumed that the coercive force of each of the soft magnetic layer 20 and the ferromagnetic layer 40 is approximate to zero in order to simplify the description. In an area (I) where the signal magnetic field H<0, the magnetization of both the soft magnetic layer 20 and the ferromagnetic layer 40 is oriented in one direction.

When the external magnetic field is intensified and H exceeds the coercive force of the soft magnetic layer 20, the magnetization direction of the soft magnetic layer is rotated in the direction of the signal magnetic field, so that the magnetization and the electrical resistance are increased as the magnetization directions of the soft magnetic layer 20 and the ferromagnetic layer 40 become antiparallel to each other. Finally, these values are fixed (state of an area (II)). At this time, a pinning magnetic field Hua is applied by the antiferromagnetic layer 50. If the signal magnetic field exceeds Hua, the magnetization of the ferromagnetic layer 40 is also rotated in the direction of the signal magnetic field, so that the magnetization of each of the soft magnetic layer 20 and the ferromagnetic layer 40 is oriented in the same direction in an area (III). At this time, the magnetization is set to a constant value, and the MR curve is equal to zero.

Conversely, when the signal magnetic field H is reduced, the magnetization is changed from the area (III) through the area (II) to the area (I) by inversion of the magnetization of the soft magnetic layer 20 and the ferromagnetic layer 40 in the same manner as described above. At an initial portion of the area (II), conduction electrons have a behavior of scattering dependent on spins, and the resistance is increased. In the area (II), the ferromagnetic layer 40 has little magnetization inversion because it is pinned, while the magnetization of the soft magnetic layer 20 increases linearly, so that the rate of spin-dependent scattered conduction electrons is gradually increased in accordance with the magnetization change of the soft magnetic layer 20. That is, if $Ni_{0.8}Fe_{0.2}$ whose Hc is low is selected for the soft magnetic layer 20 and a suitable unidirectional anisotropic magnetic field Hk is applied, a formed magnetic multilayered film has a linearly-varying resistance and a large magnetoresistance ratio in a small external magnetic field of several Oe to several tens Oe below Hk.

Hereinbelow, each constitution of the foregoing magnetoresistance effect film 3 will be described in detail. The first feature of this magnetoresistance effect film resides in regulation of the oxygen concentration or the like in the antiferromagnetic layer 50.

Figure 4:
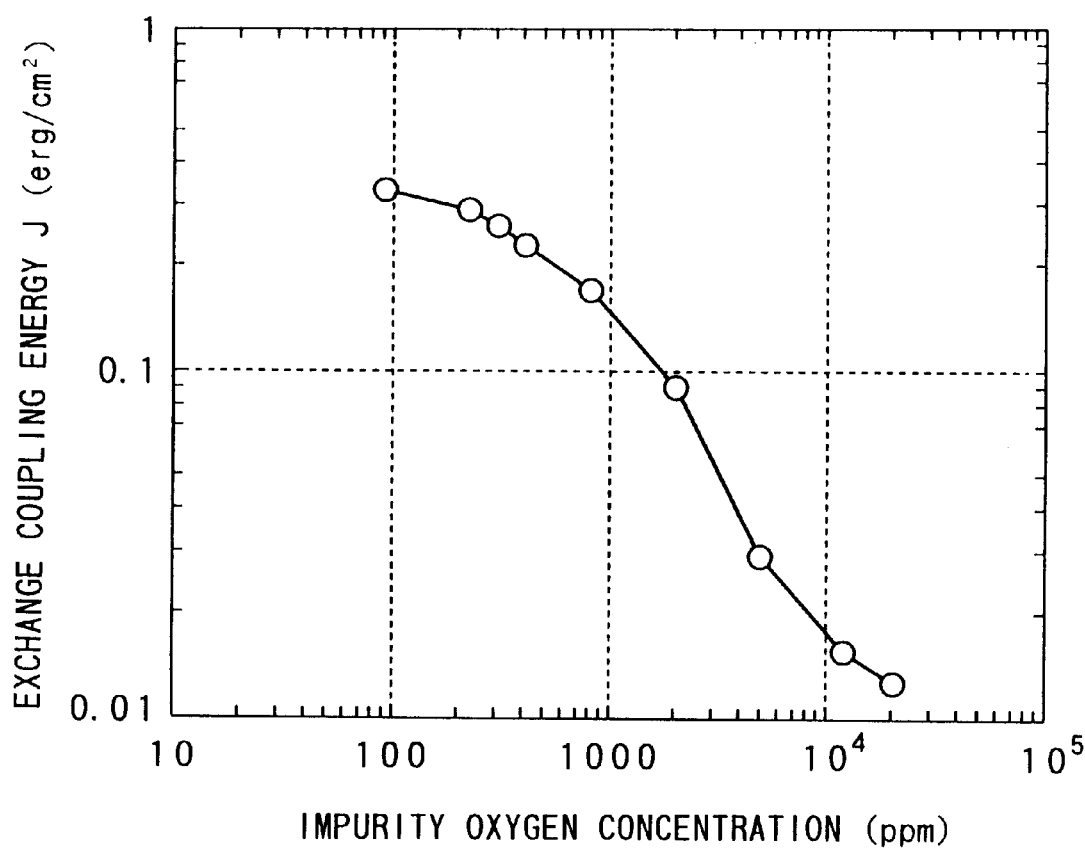
FIG. 4 is a graph showing influence of the concentration of oxygen contained in an antiferromagnetic layer as impurities, upon the exchange coupling energy J.

In the present invention, the concentration of oxygen contained in the antiferromagnetic layer 50 is regulated to 1 to 2,000 atomic ppm, preferably 1 to 1,000 atomic ppm, and more preferably 1 to 600 atomic ppm. If this value exceeds 2,000 atomic ppm, there occurs a disadvantage that a large value of the exchange coupling energy J between the antiferromagnetic layer 50 and the ferromagnetic layer 40 can not be obtained. Further, dispersion of the blocking temperatures Tb is increased so that a thin film excellent in pinning effect can not be obtained. FIG. 4 is a graph showing examined influence of the concentration of oxygen contained in the antiferromagnetic layer 50 as impurities, upon the exchange coupling energy J. This graph has been obtained through experiments by the present inventors. As seen from the graph, for achieving the exchange coupling energy J equal to or greater than 0.1 erg/cm$^2$, it is necessary that the oxygen concentration of the antiferromagnetic layer 50 be no more than 2,000 atomic ppm. It is preferable that the lower limit of the oxygen concentration approximates to zero as mush as possible, but it practically almost impossible to realize the zero oxygen concentration. Accordingly, 1 atomic ppm is regulated as a tentative standard of the limit.

For the antiferromagnetic layer 50 to be a thin film excellent in pinning effect, it is necessary to achieve a characteristic that a half-value width of a blocking temperature distribution curve of the magnetic multilayered film is no more than 80° C., and a blocking temperature dispersion degree of the magnetic multilayered film at 120° C. is no more than 0.10. Such a characteristic can be obtained only when the oxygen concentration of the antiferromagnetic layer 50 is regulated to 1 to 2,000 atomic ppm as described above.

Figure 5:
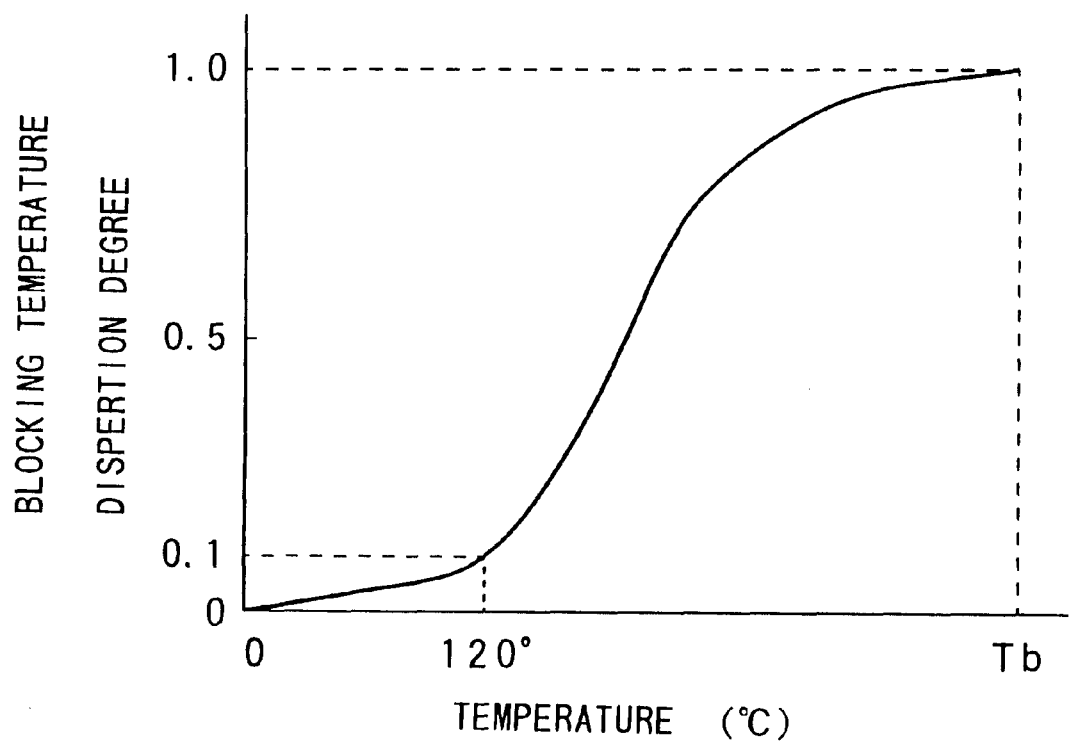
FIG. 5 is a graph showing blocking temperature dispersion degrees.

The blocking temperature dispersion degrees represent a dispersion curve showing what rates of crystal grains forming the antiferromagnetic layer 50 are subjected to reversal of magnetization at respective given temperatures before reaching the blocking temperature Tb. FIG. 5 is a graph showing an example of the blocking temperature dispersion degrees. In FIG. 5, the axis of abscissa represents the temperature, while the axis of ordinate represents the blocking temperature dispersion degree. In the magnetoresistance effect film of the present invention, it is necessary to have a characteristic that a blocking temperature dispersion degree at 120° C. is no more than 0.10, preferably no more than 0.08. How to derive a graph showing blocking temperature dispersion degrees is described in detail, for example, in the literature of "IBM J. Research and Development, vol. 34, pp 884, 1990", and a concrete measuring method can be carried out according to such literature or others. In FIG. 5, for example, when a blocking temperature dispersion degree is 0.1 at a specific temperature, it means that 10% of the crystal grains forming the antiferromagnetic layer 50 are insufficient in exchange coupling relative to the ferromagnetic layer at the specific temperature so that the ferromagnetic layer is subjected to reversal of magnetization. On the other hand, when a blocking temperature dispersion degree is 1.0, it means that 100% of the crystal grains forming the antiferromagnetic layer 50 are insufficient in exchange coupling relative to the ferromagnetic layer at the specific temperature so that the ferromagnetic layer is subjected to reversal of magnetization. If a dispersion degree exceeds 0.1 at 120° C., a pinning direction gradually deviates from a proper direction at a normal temperature in a hard disk so that an output is deteriorated.

Figure 6:
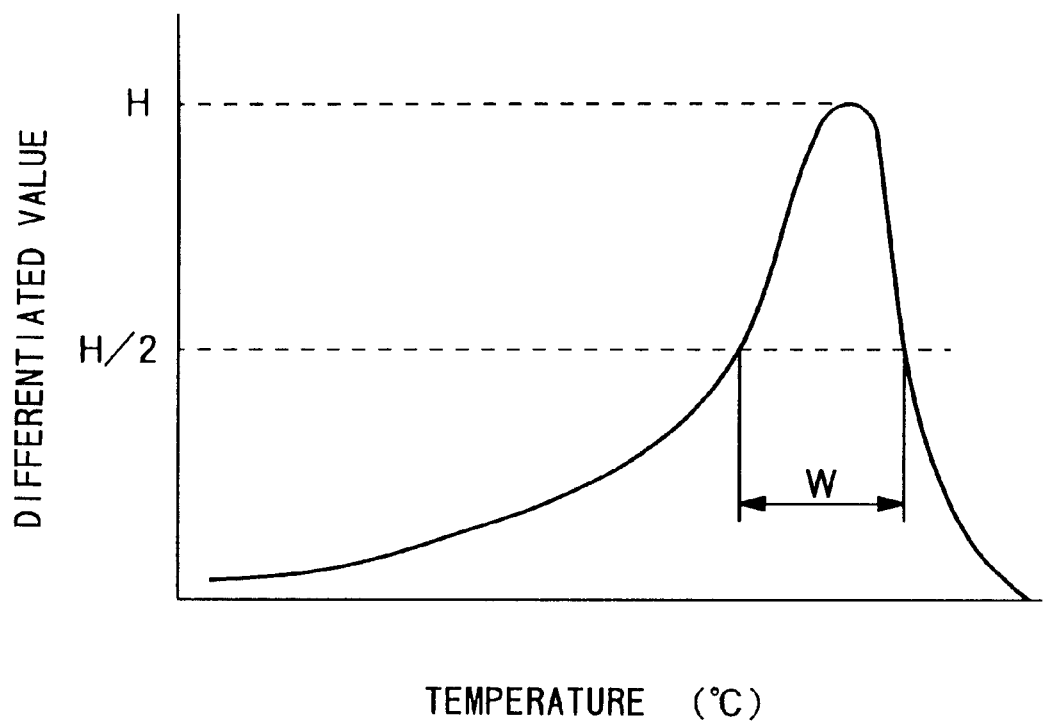
FIG. 6 is a graph showing a blocking temperature distribution curve.

By differentiating the blocking temperature dispersion degree graph shown in FIG. 5 and plotting differentiated values (axis of ordinate) relative to temperatures (axis of abscissa), a blocking temperature distribution curve is obtained. FIG. 6 is a graph showing an example of the blocking temperature distribution curve. In the magnetoresistance effect film of the present invention, it is necessary to have a characteristic that a half-value width of the blocking temperature distribution curve, that is, a temperature width W of the graph at a height corresponding to a half of a peak height H, is no more than 80° C., preferably no more than 60° C., and more preferably no more than 50° C. As the temperature width W of the graph becomes smaller, it means that the grains are more uniform in characteristic. If a value of the half-value width exceeds 80° C., the pinning direction gradually deviates from the proper direction at the normal temperature in the hard disk so that the output is deteriorated.

The exchange coupling energy J between the antiferromagnetic layer and the ferromagnetic layer, being one of characteristic evaluation items in the present invention, is defined by J=Ms•Hua•d, wherein Ms represents a saturation magnetization of the ferromagnetic layer, Hua represents a shift magnetic field due to exchange coupling, and d represents a thickness of the ferromagnetic layer. Assuming that ferromagnetic layers to be pinned are made of the same material and have the same thickness, the shift magnetic field Hua increases as a value of J increases so that an operation of the MR head becomes stable. For using as an MR head for recording density exceeding 10 Gbit/inch$^2$, a value of J needs to be no less than 0.1 erg/cm$^2$, preferably no less than 0.2 erg/cm$^2$, and more preferably no less than 0.25 erg/cm$^2$. If this value becomes less than 0.1 erg/cm$^2$, the shift magnetic field is reduced. Thus, it is possible that the pinning effect with stable spins relative to the ferromagnetic layer 40 is lost so that the stable operation as the spin valve is not revealed.

Figure 7:
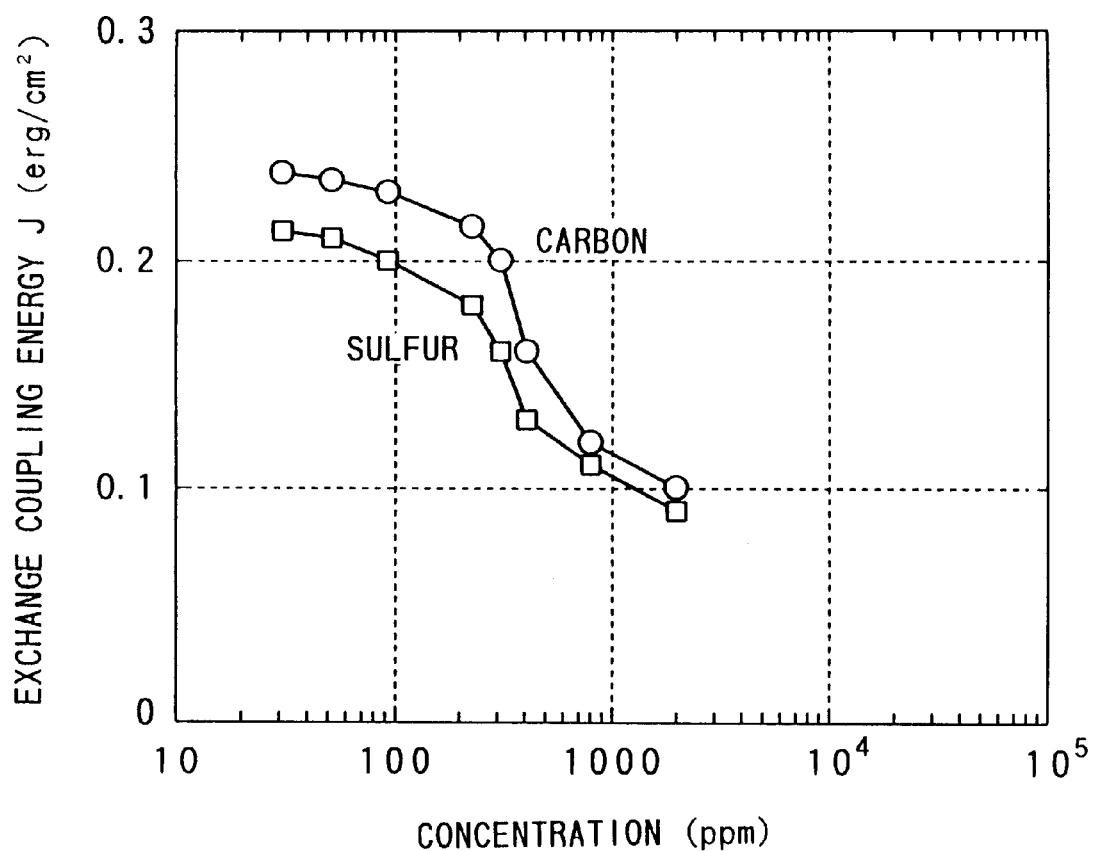
FIG. 7 is a graph showing influence of the concentrations of carbon and sulfur contained in an antiferromagnetic layer as impurities, upon the exchange coupling energy J.
Figure 8:
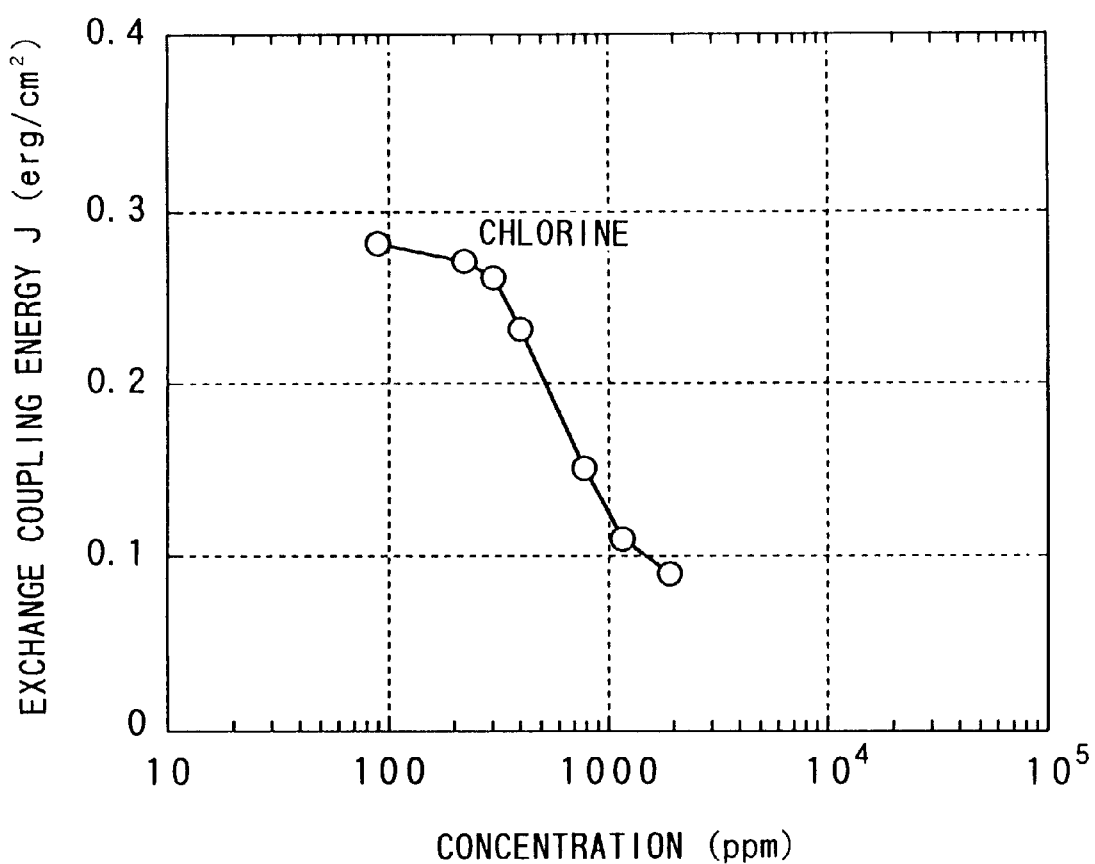
FIG. 8 is a graph showing influence of the concentration of chlorine contained in an antiferromagnetic layer as impurities, upon the exchange coupling energy J.

In the present invention, it is preferable that the antiferromagnetic layer 50 further includes at least one selected from carbon, sulfur and chlorine as impurities and that the total concentration of the impurities including at least one selected from carbon, sulfur and chlorine contained in the ferromagnetic layer 50 is set to 1 to 1,000 atomic ppm, preferably 1 to 900 atomic ppm, and more preferably 1 to 800 atomic ppm. If the foregoing total concentration exceeds 1,000 atomic ppm, there occurs a disadvantage that a large value of the exchange coupling energy J between the antiferromagnetic layer and the ferromagnetic layer can not be obtained. Further, the dispersion of the blocking temperatures Tb is increased so that the thin film excellent in pinning effect can not be obtained. FIG. 7 is a graph showing examined influence of the concentrations of carbon and sulfur contained in the antiferromagnetic layer 50 as impurities, upon the exchange coupling energy J. FIG. 8 is a graph showing examined influence of the concentration of chlorine contained in the antiferromagnetic layer 50 as impurities, upon the exchange coupling energy J.

It is preferable that the lower limit of the foregoing impurity concentration approximates to zero as mush as possible, but it practically almost impossible to realize the zero impurity concentration. Accordingly, 1 atomic ppm is regulated as a tentative standard of the limit.

It is preferable that the antiferromagnetic layer 50 has ① a two-component composition represented by $M_xMn_{100-x}$ with manganese (Mn) as an essential element or ② a three-component composition represented by $M^1_pM^2_qMn_r$ with manganese (Mn) as an essential element. In the two-component composition of $M_xM_{100-x}$, M represents one selected from Ru, Rh, Re, Pt, Pd, Au, Ag, Fe, Ni and Cr, among which Ru, Rh, Re, Pt, Pd, Ni and Cr are particularly preferable. It is preferable that the range of x (unit: atomic %) is $15 \leq x \leq 53$, preferably $16 \leq x \leq 55$, and more preferably $18 \leq x \leq 53$. If the range of x becomes less than 15 atomic %, the exchange coupling becomes extremely small. As a result, there occurs a disadvantage that the sufficient pinning effect for the ferromagnetic layer can not be achieved so that the operation as the spin valve is not accomplished. Further, if the range of x exceeds 58 atomic %, there occurs a disadvantage similar to the case of less than 15 atomic %. In the three-component composition of $M^1_pM^2_qMn_r$, each of $M^1$ and $M^2$ represents one selected from Ru, Rh, Re, Pt, Pd, Au, Ag, Fe, Ni and Cr, among which Ru, Rh, Re, Pt, Pd, Ni and Cr are particularly preferable. It is preferable that the range of p (unit: atomic %) is $1 \leq p \leq 54$, and more preferably $1 \leq p \leq 45$, that the range of q (unit: atomic %) is $1 \leq q \leq 54$, and more preferably $1 \leq q \leq 45$, that the range of r (unit: atomic %) is $45 \leq r \leq 85$, and more preferably $48 \leq r \leq 83$, and that the range of p+q is $15 \leq p+q \leq 55$, and more preferably $17 \leq p+q \leq 52$. If deviated from the foregoing ranges, the exchange coupling becomes extremely small. As a result, there occurs a disadvantage that the sufficient pinning effect for the ferromagnetic layer can not be achieved so that the operation as the spin valve is not accomplished.

The blocking temperature Tb of the foregoing antiferromagnetic layer 50 is 200° C. or higher, particularly 200° C. to 400° C., so that the antiferromagnetic layer 50 reveals the very high thermal stability.

In this embodiment, the exchange coupling energy Jk between the anti ferromagnetic layer 50 and the ferromagnetic layer 40 reveals a very high value of no less than 0.10 erg/cm², particularly 0.10 to 0.40 erg/cm². The exchange coupling energy Jk represents a strength of fixing (pinning) magnetization of the ferromagnetic layer 40 and is derived by (ferromagnetic layer saturation magnetization)×(Hua)×(thickness) as described before.

The thickness of the antiferromagnetic layer 50 is set to 5 to 100 nm, preferably 5 to 80 nm, more preferably 5 to 50 nm, still more preferably 5 to 30 nm. If the thickness of the antiferromagnetic layer 50 becomes smaller than 5 nm, the exchange coupling magnetic field Hua and the blocking temperature Tb are rapidly reduced. On the other hand, in case of being thicker, it is not so serious. However, if it is too thick, a gap length (a shield-shield length) of the MR head is so increased that it is not suitable for the ultrahigh density magnetic recording. Thus, it is preferably less than 100 nm.

The ferromagnetic layer 40 is formed of a metal element such as Fe, Ni, Co, Mn, Cr, Dy, Er, Nd, Tb, Tm, Ce, Gd, alloy or compound containing the above metal element. Particularly, it is preferably formed of a composition expressed by $(Co_zNi_{1-z})_wFe_{1-w}$ ($0.4 \leq z \leq 1.0$, $0.5 \leq w \leq 1.0$ by weight). Out of the composition range as described above, no large electrical resistance change can be obtained.

The thickness of the ferromagnetic layer 40 as described above is set to 1.6 to 10 nm, and more preferably 2 to 6 nm. If this value is smaller than 1.6 nm, it loses the characteristic as the ferromagnetic layer. On the other hand, if the value exceeds 10 nm, the pinning force of the antiferromagnetic layer 50 is reduced, and thus the sufficient pinning effect of the spin of the ferromagnetic layer can not be obtained.

As described above, since the ferromagnetic layer 40 is in direct abutment with the antiferromagnetic layer 50, a direct interlayer interaction acts on each other, and the rotation of the magnetization of the ferromagnetic layer 40 is prevented. On the other hand, with respect to the soft magnetic layer 20 as described later in detail, its magnetization can be freely rotated by a signal magnetic field from outside. As a result, a relative angle is produced in magnetization between the soft magnetic layer 20 and the ferromagnetic layer 40, so that a large MR effect due to the difference between the magnetization directions can be obtained.

In the present invention, the concentration of oxygen contained in the soft magnetic layer 20 as impurities is regulated to 1 to 800 atomic ppm, preferably 1 to 500 atomic ppm, and more preferably 1 to 300 atomic ppm. If this value exceeds 800 atomic ppm, a high-level film excellent in response relative to the external magnetic field, which is considered to be ideal, can not be obtained. As described, by regulating the oxygen concentration of the soft magnetic layer 20, the soft magnetic layer 20 can be obtained which has the physical properties that a structure factor S is no more than $30 \times 10^{-3}$ erg/cm², particularly in the range from $1 \times 10^{-3}$ to $20 \times 10^{-3}$ erg/cm² and that the absolute value of skew angle dispersion is no more than 2 deg, particularly in the range from 0.1 to 1.0 deg. This improves the output level. The structure factor S of the soft magnetic layer 20 is a parameter indicative of microscopic homogeneity of the soft magnetic layer 20, and a smaller value represents a better state. The skew angle dispersion reveals microscopic magnetization fluctuation of the soft magnetic layer 20, and a smaller value represents a better state. The structure factor S and the skew angle dispersion are measured using a dynamic differential magnetization rate measuring device. The soft magnetic layer 20 further includes at least one selected from carbon, sulfur and chlorine as impurities, and the total concentration of the impurities including at least one selected from carbon, sulfur and chlorine contained in the soft magnetic layer 20 is set to 1 to 500 atomic ppm, preferably 1 to 400 atomic ppm, and more preferably 1 to 300 atomic ppm. If the foregoing total concentration exceeds 500 atomic ppm, a film excellent in response to the external magnetic field can not be obtained, thereby not contributing to improvement in output level.

It is preferable that the lower limit of the foregoing impurity concentration approximates to zero as mush as possible, but it practically almost impossible to realize the zero impurity concentration. Accordingly, 1 atomic ppm is regulated as a tentative standard of the limit.

The soft magnetic layer 20 is formed of Fe, Ni, Co or the like revealing soft magnetic characteristics, or alloy or compound containing these elements. The MR curve rises up more sharply by using the magnetic layer having a small coercive force Hc, and a favorable effect can be obtained. It is particularly preferable that the soft magnetic layer 20 has the following two-layer structure. Specifically, the soft magnetic layer 20 is formed as a two-layer laminate body comprising, from the side of the non-magnetic layer 30, a first soft magnetic layer and a second soft magnetic layer. The first soft magnetic layer is made of a simple substance of Co (cobalt) or an alloy containing Co no less than 80 weight %. The second soft magnetic layer has a composition expressed by $(Ni_xFe_{1-x})_yCo_{1-y}$ ($0.7 \leq x \leq 0.9$, $0.5 \leq y \leq 0.8$ by weight). With this arrangement, the first soft magnetic layer with Co being rich works as a diffusion blocking layer so as to prevent diffusion of Ni from the side of the second soft magnetic layer toward the non-magnetic metal layer 30. Further, since the first soft magnetic layer with Co being rich enhances the scattering of electrons, the MR change ratio is improved. The second soft magnetic layer is formed within the foregoing composition range for maintaining the soft magnetic characteristic.

The thickness of the soft magnetic layer 20 as described above is set to 2 to 15 nm, preferably 3 to 15 nm, and more preferably 5 to 15 nm. If this value is smaller than 2 nm, no excellent characteristic as the soft magnetic layer can be obtained. On the other hand, if the value exceeds 15 nm, the total thickness of the multilayered film is large and the resistance of the whole magnetic multilayered film is increased, so that the MR effect is reduced. When the soft magnetic layer 20 is in the form of the foregoing two-layer laminate body, it is sufficient to set the thickness of the Co-rich first soft magnetic layer to be no less than 0.4 nm.

In order to conduct electrons efficiently, a metal having conductivity is preferably used for the non-magnetic metal layer which is interposed between the soft magnetic layer 20 and the ferromagnetic layer 40. More specifically, it may be formed of at least one selected from Au, Ag and Cu, alloy containing 60 weight % or more of at least one of these elements, or the like.

The thickness of the non-magnetic metal layer 30 is preferably set to 1.5 to 4 nm. If this value is smaller than 1.5 nm, the soft magnetic layer 20 and the ferromagnetic layer 40 which are disposed through the non-magnetic metal layer are exchange-coupled to each other, so that the spins of the soft magnetic layer 20 and the ferromagnetic layer 40 do not function independently of each other. If this value exceeds 4 nm, the rate of the electrons which are scattered at the interface between the soft magnetic layer 20 and the ferromagnetic layer 40 disposed at the upper and lower sides respectively are reduced, so that the MR change ratio is reduced.

The protection layer 80 is provided to prevent oxidation of the surface of the magnetic multilayered film in a film-forming process and improve wettability with electrode material formed thereon and adhesive strength. The protection layer 80 is formed of Ti, Ta, W, Cr, Hf, Zr, Zn or the like. The thickness thereof is generally set to about 3 to 30 nm.

The substrate 5 is formed of glass, silicon, MgO, GaAs, ferrite, AlTiC, $CaTiO_3$ or the like, and the thickness thereof is generally set to about 0.5 to 10 mm.

The material of each layer and the thickness thereof are specified as described above, and an external magnetic field is applied in a direction within the film surface as described later at the film formation time of at least the soft magnetic layer 20 to apply anisotropic magnetic field Hk of 2 to 200 e, preferably 2 to 160 e, and more preferably 2 to 100 e.

If the anisotropic magnetic field Hk of the soft magnetic layer is lower than 20 e, it is equal to the same degree of the coercive force, and no linear MR change curve can be substantially obtained in the vicinity of zero magnetic field, so that the characteristic as the MR element is deteriorated. On the other hand, if it is higher than 200 e, when this film is applied to the MR head or the like, the output is liable to be reduced and the resolution is reduced. The value Hk as described above can be obtained by applying the external magnetic field of 10 to 3000 e at the film formation. If the external magnetic field is no greater than 100 e, it is too insufficient to induce Hk. On the other hand, if it exceeds 3000 e, the effect is not improved although a coil must be designed in large size due to an occurrence of magnetic field. Therefore, the cost is increased and thus it is inefficient.

The magnetic multilayered film 1 may be repetitively laminated to form a magnetoresistance effect film. In this case, the repetitive lamination frequency n of the magnetic multilayered film is not limited to a specific value, and it may be suitably selected in accordance with a desired magnetoresistance ratio, etc. In order to satisfy the present requirement for ultrahigh densification of the magnetic recording, the smaller total film thickness of the magnetic multilayered film is better. However, if the film is thinner, the MR effect is usually reduced. The magnetic multilayered film of this invention can be used in practice to a sufficient level, even when the repetitive lamination frequency n is 1. Furthermore, as the lamination frequency is increased, the magnetoresistance ratio increases while productivity is lowered. If n is excessively large, the resistance of the whole element is excessively low, and it is practically inconvenient. Therefore, usually, n is preferably set to 10 or less. The preferable range of n is 1 to 5.

The film formation of each layer of the foregoing magnetic multilayered film 1 is performed by a sputtering method. Upon formation of the magnetic multilayered film 1, particularly, upon formation of the antiferromagnetic layer 50 and the soft magnetic layer 20, an ultimate pressure in a vacuum film forming apparatus is set to $2 \times 10^{-9}$ Torr or less, preferably $8 \times 10^{-10}$ Torr or less, and more preferably $2 \times 10^{-10}$ Torr or less. The ultimate pressure is defined as a pressure in the film forming apparatus before the start of film formation, and differs from a pressure upon film formation.

Figure 9:
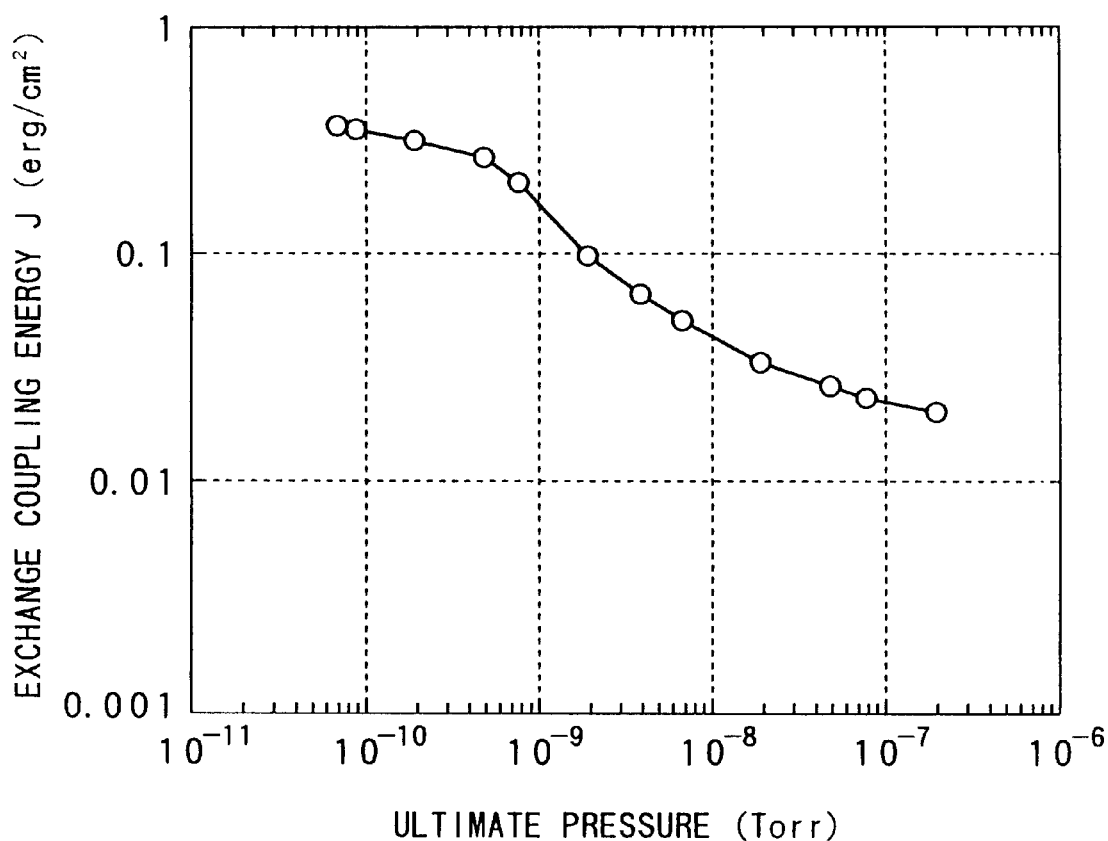
FIG. 9 is a graph showing influence of the ultimate pressure in a vacuum film forming apparatus, upon the exchange coupling energy J.

If a value of the ultimate pressure exceeds $2 \times 10^{-9}$ Torr, the antiferromagnetic layer 50 or the soft magnetic layer 20 having the characteristic of the present invention can not be formed. FIG. 9 is a graph showing examined influence of the ultimate pressure in the vacuum film forming apparatus, upon the exchange coupling energy J. This graph has been obtained through experiments. As seen from FIG. 9, it is necessary that the ultimate pressure in the vacuum film forming apparatus be set to $2 \times 10^{-9}$ Torr or less for achieving the exchange coupling energy of no less than 0.1 erg/cm².

The range of the ultimate pressure of no more than $2 \times 10^{-9}$ Torr is a range which has not been proposed in view of improving the film quality. For accomplishing the condition of the ultimate pressure of no more than $2 \times 10^{-9}$ Torr, what is not carried out in general is required with respect to a sputtering apparatus. Specifically, it is necessary that vacuum seal portions be all metal gaskets, that the apparatus be all formed of stainless steel or aluminum, that degassing be carried out at high temperature under vacuum upon assembling the apparatus, that, during degassing, the whole vacuum vessel be baked to high temperatures so as to thoroughly and forcibly discharge residual gas and $H_2O$, and that an exhaust pump operable under $2 \times 10^{-9}$ Torr or less be used.

For forming the antiferromagnetic layer 50, the concentration of oxygen contained in a target used in the sputtering method is set to 1 to 600 ppm, preferably 1 to 500 ppm, and more preferably 1 to 300 ppm. On the other hand, for forming the soft magnetic layer 20, the oxygen concentration of a target is set to 1 to 100 ppm, and preferably 1 to 80 ppm. If the oxygen concentrations of the targets exceed the forgoing ranges, respectively, it is difficult to form the antiferromagnetic layer 50 and the soft magnetic layer 20 having the characteristics of the present invention, respectively. The oxygen concentration of the target is derived through analysis using the amount of $CO_2$ gas produced by burning a portion of the target. Further, the total concentration of impurities (for example, $H_2O$, $CO_2$ and He) in the sputtering gas introduced upon sputtering is set to 0.1 to 100 ppb, preferably 0.1 to 50 ppb, more preferably 0.1 to 10 ppb, and still more preferably 0.1 to 5 ppb. If the impurity concentration in the sputtering gas exceeds 100 ppb, the antiferromagnetic layer 50 and the soft magnetic layer 20 having the characteristics of the present invention can not be formed. Particularly, the $H_2O$ impurity concentration in the sputtering gas is liable to influence the film quality and needs to be set to no more than 40 ppb, preferably no more than 10 ppb, and more preferably no more than 5 ppb.

An operating pressure in the vacuum film forming apparatus during actual film formation is normally set to $1\times10^{-4}$ to $1\times10^{-2}$ Torr.

It is preferable that the film formation of the respective layers of the magnetic multilayered film 1 in the present invention is carried out according to the foregoing film forming conditions for further improving the characteristic of the magnetoresistance effect film.

As the substrate 5, glass, silicon, MgO, GaAs, ferrite, AlTiC, $CaTiO_3$ or the like may be used. For the film formation, it is preferable that an external magnetic field of 10 to 3000 e is applied in one direction within the film plane at the film formation of the soft magnetic layer 20. With this operation, the anisotropic magnetic field Hk can be provided to the soft magnetic layer 20. The application of the external magnetic field may be performed at only the film formation time of the soft magnetic field, for example, using a device which is equipped with an electromagnet or the like which is capable of easily controlling an application timing of the magnetic field, and no external magnetic field is applied at the film formation time of the antiferromagnetic layer 50. Alternatively, a method of applying a constant magnetic field at the film formation time at all times may be used.

As described above, by applying the external magnetic field in one direction within the film plane at least upon film formation of the soft magnetic layer 20 to induce the anisotropic magnetic field Hk, the high frequency characteristic can be further improved.

Furthermore, when forming the pinning player 50, the magnetic field is preferably applied in a direction perpendicular to the direction of the magnetic field applied at the film formation time of the soft magnetic film 20. Specifically, it is applied within the film plane of the magnetic multilayered film and in a direction orthogonal to the measurement current. The magnitude of the applied magnetic field is preferably set in the range of 10 to 3000 e. With this operation, the magnetization direction of the ferromagnetic layer 40 is surely fixed in the applied magnetic field direction (direction perpendicular to the measurement current) by the antiferromagnetic layer 50, whereby the magnetization of the ferromagnetic layer can be most reasonably set to be antiparallel to the magnetization of the soft magnetic layer 20 whose direction can be freely changed by the signal magnetic field. However, this is not a necessary condition, and the direction of the magnetic field to be applied at the film formation time of the antiferromagnetic layer may be coincident with the direction of the magnetization of the magnetic field to be applied at the film formation time of the soft magnetic layer. At this time, it is preferable that the temperature is decreased while applying the magnetic field in a strip short-side direction (direction perpendicular to the direction of the applied magnetic field when the soft magnetic layer 20 is formed), when the heat treatment at about 200° C. is carried out in the process after the magnetic multilayered film is formed.

The magnetoresistance effect film 3 having the magnetic multilayered film 1 as described in the foregoing embodiment is applied to a magnetoresistance effect type head (MR head), an MR sensor, a ferromagnetic memory element, an angle sensor or the like.

Hereinbelow, explanation will be given to an example where the magnetoresistance effect film 3 is applied to the magnetoresistance effect type head. As the magnetoresistance effect type head in the present invention, a spin valve head having a magnetic multilayered film revealing the giant magnetoresistance effect (GMR) may be cited as a preferred example.

Hereinbelow, the spin valve head will be picked up as the magnetoresistance effect type head (MR head) and given explanation.

Figure 10:
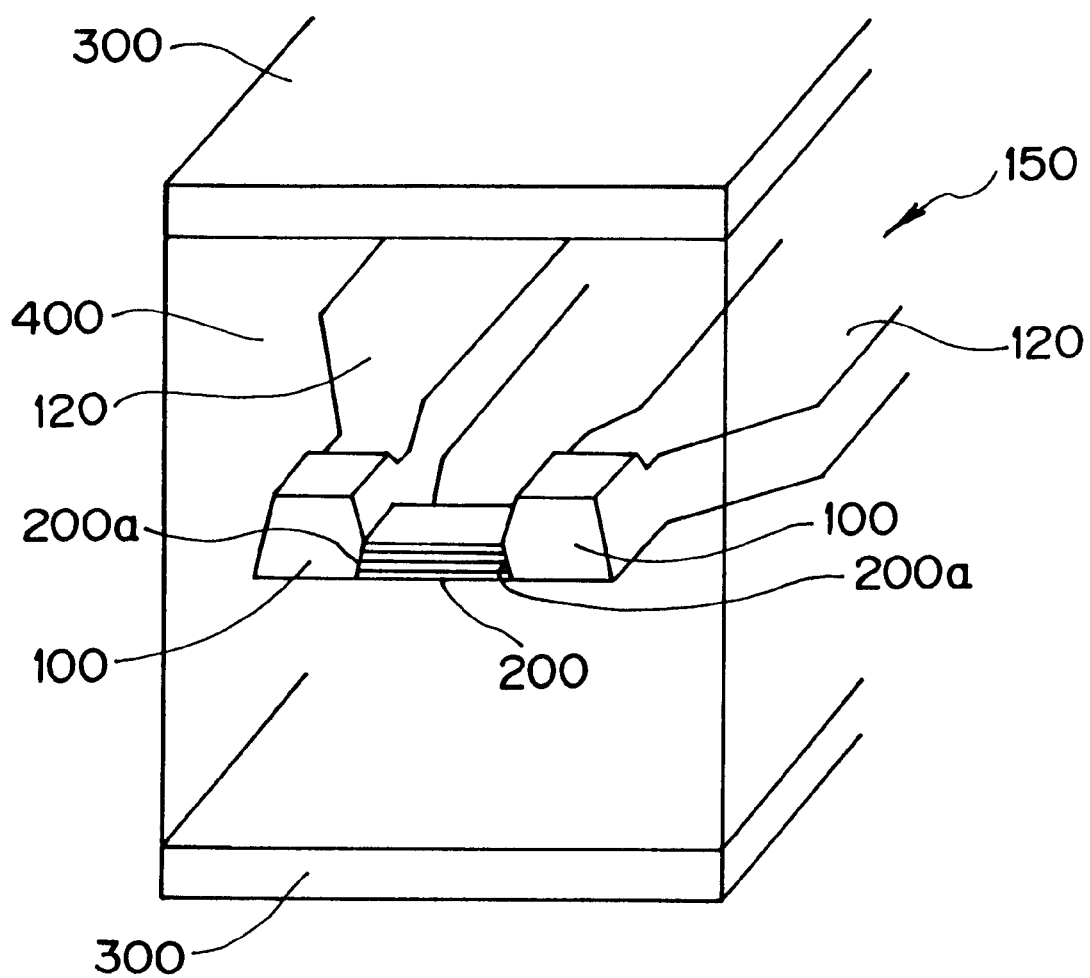
FIG. 10 is a schematic perspective view showing an example of a magnetoresistance effect type head according to the present invention.

As shown in FIG. 10, a magnetoresistance effect type head (MR head) 150 includes a magnetoresistance effect film 200 serving as a magnetically-sensitive portion for magnetically sensing a signal magnetic field, and electrode portions 100, 100 which are formed at both end portions 200*a*, 200*a* of the magnetoresistance effect film 200. Preferably, the whole both end portions 200*a*, 200*a* of the magnetoresistance effect film 200 serving as the magnetically-sensitive portion are connected to the electrode portions 100, 100. Conductive films 120, 120 are electrically conducted to the magnetoresistance effect film 200 through the electrode portions 100, 100. In this invention, the conductive film 120 and the electrode portion 100 are individually shown to simplify the description which will be made later, while in most cases the conductive film 120 and the electrode portion 100 are formed integral with each other by a thin film forming method. Accordingly, these elements may be considered as being formed of one member.

The magnetoresistance effect film 200 serving as the magnetically-sensitive portion of the MR head has substantially the same laminate structure as the magnetoresistance effect film 3 having the magnetic multilayered film 1 shown in FIG. 1. That is, the magnetoresistance effect film 200 is replaced by the magnetoresistance effect film 3 having the magnetic multilayered film shown in FIG. 1, so that the magnetoresistance effect film 200 includes a non-magnetic metal layer 30, a ferromagnetic layer 40 formed on one surface of the non-magnetic metal layer 30, a soft magnetic layer 20 formed on the other surface of the non-magnetic metal layer 30, and an antiferromagnetic layer 50 formed on the ferromagnetic layer 40 (on a surface opposite to a surface abutting the non-magnetic metal layer 30) to pin the magnetization direction of the ferromagnetic layer 40.

The important point is that the thus formed magnetoresistance effect film 200 exhibits the so-called spin-valve type magnetoresistance change. The spin-valve type magnetoresistance change represents that, in the magnetic multilayered film having the non-magnetic metal layer 30, the ferromagnetic layer 40 formed on one surface of the non-magnetic metal layer 30, the soft magnetic layer 20 formed on the other surface of the non-magnetic metal layer 30 and the antiferromagnetic layer 50 formed on the ferromagnetic layer for pinning the magnetization direction of the ferromagnetic layer 40, an angle formed between the spin of the soft magnetic layer 20 and the spin of the pinned ferromagnetic layer 40 is set to approximately 90 degrees in an acute angle when the external signal magnetic field is zero. In practice, the angle may be 45 to 90 degrees, and most preferably 90 degrees (orthogonalization of magnetization) for causing the magnetoresistance effect curve (MR curve) to be asymmetrical relative to the plus and minus external magnetic fields with respect to the zero external magnetic field.

For achieving the orthogonalization of magnetization, it is necessary that the magnetic multilayered film 1 is subjected to a vacuum heat treatment at no less than the blocking temperature Tb of the antiferromagnetic layer 50 in the magnetic field. This treatment is called an orthogonalization heat treatment, and a temperature during the treatment is called an orthogonalization temperature. It is also possible to provide the orthogonalization of magnetization in advance by applying the magnetic field during the film formation. However, in this case, the orthogonalization state may be disturbed by the unavoidable heat applied during the subsequent head fabricating process. Thus, it is preferable to carry out the orthogonalization heat treatment at the final stage of the head fabricating process. In the orthogonalization heat treatment, it is preferable to change only the magnetization direction of the antiferromagnetic layer 50. Preferably, the orthogonalization temperature is higher than the blocking temperature Tb and lower than a temperature at which the induced magnetic anisotropy of the soft magnetic layer 20 is lost. If the orthogonalization heat treatment is carried out when the blocking temperature Tb is higher than the temperature at which the induced magnetic anisotropy of the soft magnetic layer 20 is lost, the magnetization direction of the soft magnetic layer 20 is oriented in a magnetization easy axis direction relative to the external magnetic field so that the magnetoresistance effect curve relative to the external magnetic field is subjected to hysteresis to cause a problem in linearity. Simultaneously, the output is lowered. On the other hand, when the blocking temperature Tb is too lower than the temperature at which the induced magnetic anisotropy of the soft magnetic layer 20 is lost, the exchange coupling magnetic field Hua is deteriorated due to heat applied during operation of an MR sensor in the magnetic recording system and during the spin valve head fabricating process so that the magnetic multilayered film can not work as a spin valve film. That is, it is preferable to form the antiferromagnetic layer 50 having the blocking temperature Tb which is a little lower than the temperature at which the induced magnetic anisotropy of the soft magnetic layer 20 is lost, and carry out the orthogonalization heat treatment. In the present invention, by setting a composition of the antiferromagnetic layer 50 within the foregoing range, the blocking temperature Tb is selectable in the range of 160 to 400° C. The orthogonalization heat treatment is performed in the range of about 150 to 410° C.

As shown in FIG. 10, in the magnetoresistance effect type head (MR head) 150, shield layers 300, 300 are formed so as to sandwich the magnetoresistance effect film 200 and the electrode portions 100, 100 at the upper and lower sides, and a non-magnetic insulation layer 400 is formed at a portion between the magnetoresistance effect film 200 and the shield layers 300, 300.

The same materials and thicknesses as described in the foregoing embodiment of the magnetic multilayered film are preferably used for the ferromagnetic layer 40, the non-magnetic metal layer 30, the soft magnetic layer 20 and the anti ferromagnetic layer 50 used in the magnetoresistance effect film 200 as the magnetically-sensitive portion.

As shown in FIG. 10, the current-flowing electrode portions 100 are arranged so that both end portions 200a, 200a of the magnetoresistance effect film 200 are wholly contacted with the electrode portions 100 in the laminate direction of the magnetoresistance effect film 200. Then, the electrons intensively flow through the portion sandwiched between the soft magnetic layer 20 and the ferromagnetic layer 40. At this time, the electrons are magnetically scattered in accordance with the spin directions of the soft magnetic layer 20 and the ferromagnetic layer 40, so that the resistance is greatly varied. Accordingly, a fine change of the external magnetic field can be detected as a large change of electrical resistance.

Figure 11:
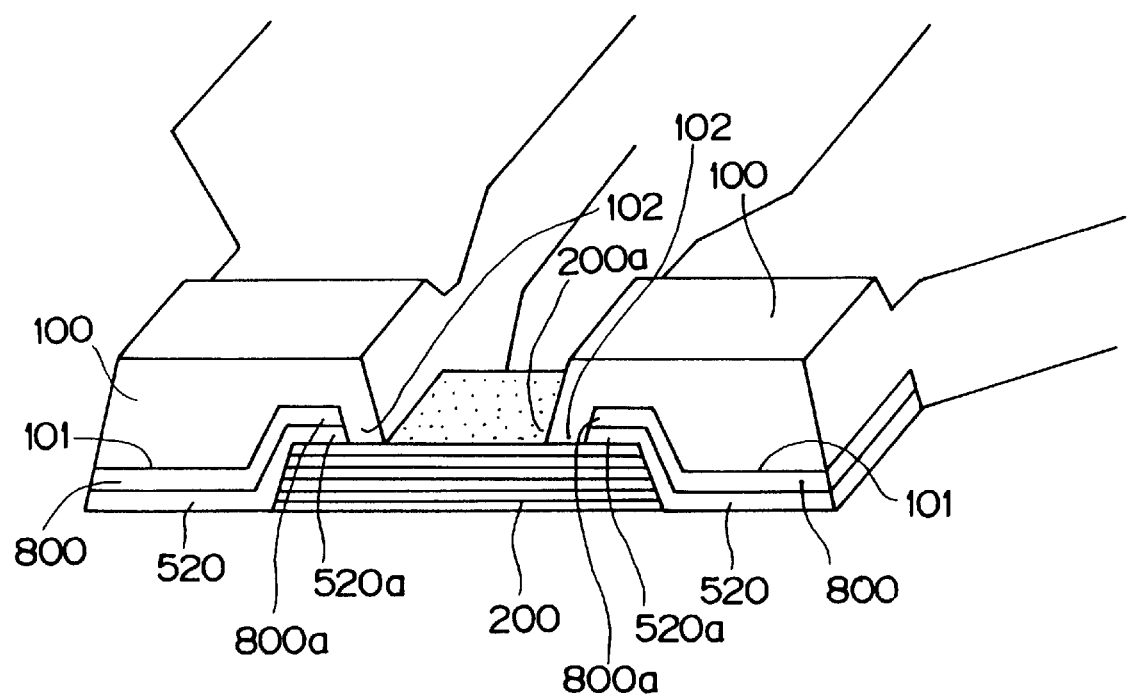
FIG. 11 is a schematic perspective view showing a preferred connection state between a magnetoresistance effect film and electrode portions of a magnetoresistance effect type head according to the present invention.

It is particularly preferable that the MR head having the spin valve film of the present invention has a head structure as shown in FIG. 11. Specifically, between the magnetoresistance effect film 200 working as a magnetically-sensitive portion and the electrode portions 100 for conducting the measurement current, linking soft magnetic layers 520 and antiferromagnetic layers 800 (or hard magnetic layer 800) are interposed in order from the side of the magnetoresistance effect film 200 as shown in the drawing. Further, the linking soft magnetic layer 520 and the antiferromagnetic layer 800 (or hard magnetic layer 800) are formed such that their one end side covers a portion of an upper side 200a (near the soft magnetic layer) of the magnetoresistance effect film 200 and their other end side gets under a lower surface 101 of the electrode portion 100 as shown in the drawing. Further, an end portion 102, located at the head center side, of the electrode portion 100 is formed so as to cover a portion of the upper side 200a (near the soft magnetic layer) of the magnetoresistance effect film 200 and also cover upper end portions 520a, 800a of the linking soft magnetic layer 520 and the antiferromagnetic layer 800, respectively. The linking soft magnetic layer 520 is about 10 nm in thickness and made of, for example, NiFe, NiFeCr, NiFeRh, NiFeRu, CoZrNb, FeAlSi and FeZrN. The antiferromagnetic layer 800 is about 50 nm in thickness and made of, for example, $Ru_5Rh_{15}Mn$, NiMn, FeMn, PtMn and $\alpha-Fe_2O_3$. The hard magnetic layer 800 is about 50 nm in thickness and made of, for example, CoPt and CoPtCr.

With such an arrangement, through effects of both the linking soft magnetic layers 520 and the antiferromagnetic layers 800 formed at the magnetoresistance effect film 200, the longitudinal bias can be given quite efficiently so that the MR head which can suppress the Barkhausen noises can be achieved. Further, since the end portions 102 of the electrode port ions 100 are formed so as to cover the magnetoresistance effect film 200, the MR head can be provided wherein the signal magnetic field is not lowered at the end portions of the element, and further, the formation of narrow track width, such as no greater than 1 $\mu$m, is easy.

When these MR heads are manufactured, heat treatments such as baking, annealing, resist curing, etc. are indispensable for a patterning process, a flattening process, etc. in the manufacturing process.

In general, a problem of heat-resistance frequently occurs in the magnetoresistance effect film having the foregoing magnetic multilayered film due to the thickness of each layer. According to the magnetoresistance effect film (magnetic multilayered film) of the present invention, the magnetic field is applied to provide anisotropic magnetic field in the magnetic layer, so that, after the film formation, it can endure a heat treatment at a temperature 300° C. or less, generally 100 to 300° C. for about one hour. The heat treatment is generally performed under vacuum, inert gas atmosphere, or atmospheric air. Particularly, if the heat treatment is conducted under a vacuum (pressure-reduced) state at $10^{-7}$ Torr or less, a magnetoresistance effect film (magnetic multilayered film) whose characteristic is extremely less deteriorated can be obtained. Furthermore, the MR characteristic is little deteriorated even by lapping or polishing in the processing step.

The invention of the foregoing magnetoresistance effect film and the invention of the magnetoresistance effect type head using such a magnetoresistance effect film will be explained in further detail based on the following concrete examples:

EXAMPLE 1

First, experiments were carried out for examining influence of the concentration of oxygen contained in the antiferromagnetic layer as impurities, upon the exchange coupling energy J (erg/cm$^2$) between the antiferromagnetic layer and the ferromagnetic layer and upon the blocking temperature Tb.

Samples were prepared. Specifically, each of the samples was prepared by stacking, on a glass substrate, a ground layer (Ta; 5 nm in thickness), a ferromagnetic layer 40 (NiFe; 10 nm in thickness), an antiferromagnetic layer 50 (10 to 15 nm in thickness), and a protective layer 80 (Ta; 5 nm in thickness) in the order named.

The samples were prepared by changing materials and composition ratios of the antiferromagnetic layers 50 as shown in Table 1. In Table 1, material elements corresponding to $Ru_{x1}M_{y1}Mn_{z1}$ are given by (m1, m2, m3), and composition ratios thereof are given by (x1, y1, z1).

With respect to samples Nos. 1-1 to 1-11 of the present invention shown in Table 1, the ultimate pressure in the vacuum film forming apparatus was set to $8 \times 10^{-10}$ Torr, the oxygen concentrations of the targets were set to 200 to 500 ppm, and the impurity concentration in the sputtering gas was set to 30 ppb where the H$_2$O concentration was set to 8 ppb. On the other hand, with respect to comparative samples Nos. 1-12 to 1-17 shown in Table 1, the ultimate pressure in the vacuum film forming apparatus was set to $3 \times 10^{-7}$ Torr, the oxygen concentrations of the targets were set to 5,800 ppm, and the impurity concentration in the sputtering gas was set to 300 ppb where the H$_2$O concentration was set to 140 ppb. The impurity concentrations (oxygen concentration, carbon concentration, sulfur concentration, chlorine concentration) in each antiferromagnetic layer, the exchange coupling energy J (erg/cm$^2$) and the blocking temperature Tb were measured in the manners described below. Further, for examining the film characteristic of each sample in detail, the Tb dispersion degree at 120° C. and the Tb dispersion degree half-value width (°C.) were measured in the manners described below.

Measuring Method of Concentration of Impurity Contained in Antiferromagnetic Layer Evaluation should be carried out relative to an antiferromagnetic layer having a thickness used in an actual head, which, however, exceeds the limit of analysis. Accordingly, an antiferromagnetic layer having a thickness of about 1 to 3 μm is formed under the same film forming condition and using the same film forming apparatus as those for forming an actual magnetoresistance effect film. In this case, for preventing influence from a side of the substrate, a proper buffer layer of metal is provided and, for preventing oxidation, a protective layer of other meal is provided as a top layer. Thereafter, quantitative analysis is carried out using a secondary ion mass spectroscopy (SIMS).

Measuring Method of Exchange Coupling Energy J (erg/cm$^2$)

Figure 14:
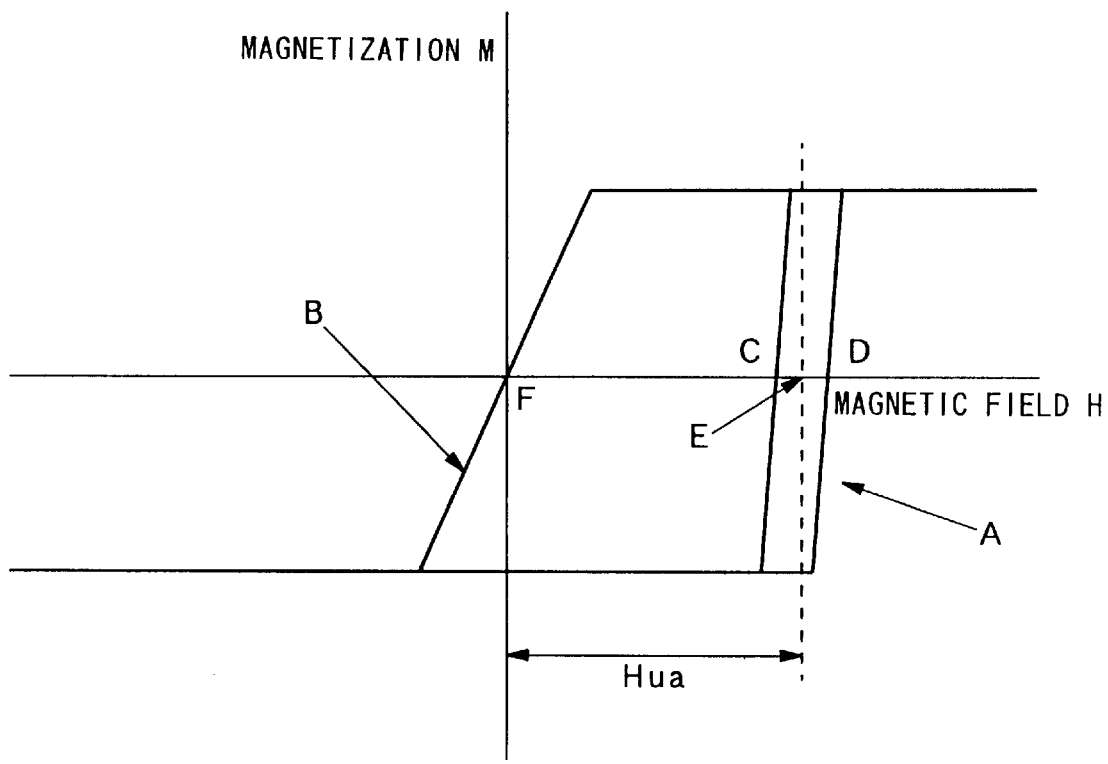
FIG. 14 is a diagram showing an M-H loop according to the present invention.

Magnetization curves are described in a magnetic field of 1 KOe using a vibration sample type magnetometer (VSM), and the exchange coupling magnetic field Hua is derived from such magnetization curves. FIG. 14 shows a typical example of the magnetization curves measured by the vibration sample type magnetometer (VSM). In the drawing, a magnetization curve A shows a magnetization easy axis direction (direction in which the magnetic field was applied upon film formation), and a magnetization curve B shows a magnetization hard axis direction. As shown in FIG. 14, the magnetization curve in the direction of the magnetization easy axis shifts from the origin F due to the exchange coupling magnetic field Hua. A magnetic field at point E (middle point between point C and point D) shifting from the origin F is defined as Hua. A value of the exchange coupling magnetic field Hua is converted into a value of the exchange coupling energy J using the following equation (1):

$$J = Ms * Hua * d \quad (1)$$

wherein Ms represents a saturation magnetization of the ferromagnetic layer, and d represents a thickness of the ferromagnetic layer.

Measuring Method of Blocking Temperature Tb

While increasing the temperature, a temperature at which Hua indicative of a strength of the exchange coupling is lost is a blocking temperature Tb.

Tb Dispersion Degree at 120° C.

The temperature is increased to a value higher than an expected blocking temperature Tb. While applying a magnetic field of about 0.2 to 5 KOe in a given fixed direction, the temperature is gradually lowered to a room temperature by about 1 to 10° C./min. As a result, Hua is generated in the applied magnetic field. Thereafter, while applying a magnetic field in the direction of Hua, heating is again applied to increase the temperature to higher than the blocking temperature Tb. Subsequently, while continuing to apply the magnetic field in the same direction, cooling is applied. In a moment when a sample is cooled down to a temperature T (every 10 to 30° C. from room temperature to 300° C.) at which Tb dispersion is measured, the direction of the magnetic field is reversed by 180 degrees. This reverses the magnetization of the grains having local Tb below the set temperature so that a value of Hua is reduced from +Hua every time the set temperature is increased, so as to reach −Hua. Assuming that a measured value of Hua at the set temperature is Hua(T), a reversal ratio R is defined by R(T)=1.0−(Hua−Hua(T))/2 Hua. A further detailed measuring method is described in the literature "IBM J. Research and Development, vol. 34, pp 884, 1990" and "J. Appl. Phys., vol. 76, pp 5,356, 1994".

120° C. is used as a criterion because an actual head operation is carried out at 100 to 120° C. and the ratio of Tb dispersion should be low at this temperature region (120° C.). It can be said to be better as this value approximates to zero.

On the other hand, as another measuring method of Tb dispersion degree, while applying a magnetic field in a Hua direction of a sample generating Hua, heating is again applied. Then, in a moment when the temperature of the sample is increased to a temperature T (every 10 to 30° C. from room temperature to 300° C., in order from a lower temperature) at which the Tb dispersion degree is measured, the direction of magnetization is reversed by 180 degrees. Thereafter, cooling is immediately started. After the temperature of the sample is cooled to the room temperature, Hua is measured. Upon the next measurement, a magnetic field is again applied in the initial Hua direction and, at the next measuring temperature T higher than the prior measuring temperature, magnetization reversal and cooling are carried out. A subsequent analysis is the same as the foregoing.

Tb Dispersion Degree Half-Value Width (°C.)

By plotting values obtained by differentiating the reversal ratios at the foregoing Tb dispersion degrees with temperature, that is, values of $dR(T)/dT$, relative to temperatures, a distribution curve having a given peak is obtained and a half-value width of this peak is derived. The distribution curve shows how is the ratio of the grains having certain Tb. Thus, as the distribution curve becomes narrower, it can be said that an ideal thin film is formed. This degree of dispersion is represented the half-value width of the Tb distribution curve so as to be the Tb dispersion half-value width.

Patent Publication No. 8-63715 corresponding to the prior art; sample No. 1-14).

Further, when the concentration of oxygen contained in the antiferromagnetic layer as impurities is no more than 2,000 atomic ppm, the Tb dispersion degree at 120° C. is small to provide an excellent film wherein the partial magnetization reversal in the antiferromagnetic layer is quite small around this temperature. It is seen that the Tb dispersion degree half-value width is also small and the antiferromagnetic layer is formed of the grains having the highly uniform characteristics. Further, it was confirmed that, as a condition required for accomplishing the oxygen concentration of the antiferromagnetic layer of no more than 2,000 atomic ppm, the setting of the ultimate pressure in the vacuum film forming apparatus to be no more than $2 \times 10^{-9}$ Torr was an important factor. Incidentally, it was confirmed that, if the ultimate pressure in the vacuum film forming apparatus was changed to $1 \times 10^{-8}$ Torr, the oxygen concentration of the antiferromagnetic layer was rapidly increased to exceed 2,000 atomic ppm.

Further, in preparation of the sample No. 1-1 of the present invention shown in Table 1, it was confirmed that, when a target with the oxygen concentration exceeding 600 ppm was used, or the total concentration of impurities in the sputtering gas introduced during film formation exceeds 100 ppb, the oxygen concentration of the antiferromagnetic layer was rapidly increased to exceed 2,000 atomic ppm. It was also confirmed that, when the $H_2O$ concentration in the sputtering gas exceeds 40 ppb, the oxygen concentration of the antiferromagnetic layer was rapidly increased to exceed 2,000 atomic ppm.

EXAMPLE 2

Experiments were carried out for examining influence of the concentrations of carbon, sulfur and chlorine contained

TABLE 1

| Sample No. | Antiferromagnetic Layer (m1, m2, m3) | (x1, y1, z1) | Oxygen Conc. (ppm) | Carbon Conc. (ppm) | Sulfer Conc. (ppm) | Chlorine Conc. (ppm) | Tb (° C.) | J (erg/cm$^2$) | Tb Dispersion Degree at 120° C. | Tb Dispersion Half-Value Width (° C.) |
|---|---|---|---|---|---|---|---|---|---|---|
| 1-1 | (Ru, Rh, Mn) | (8, 10, 82) | 520 | 280 | 89 | 480 | 245 | 0.22 | 0.09 | 55 |
| 1-2 | (Ru, Rh, Mn) | (4, 15, 81) | 480 | 260 | 77 | 450 | 250 | 0.24 | 0.09 | 53 |
| 1-3 | (Ru, Rh, Mn) | (1, 19, 80) | 450 | 250 | 74 | 420 | 240 | 0.23 | 0.08 | 43 |
| 1-4 | (—, Rh, Mn) | (0, 21, 79) | 440 | 240 | 70 | 400 | 250 | 0.24 | 0.07 | 40 |
| 1-5 | (—, Pt, Mn) | (0, 49, 51) | 250 | 160 | 70 | 380 | 380 | 0.36 | 0.03 | 27 |
| 1-6 | (Ru, Pt, Mn) | (3, 48, 49) | 280 | 200 | 78 | 410 | 350 | 0.34 | 0.04 | 31 |
| 1-7 | (Ru, Pt, Mn) | (10, 42, 48) | 320 | 210 | 72 | 430 | 330 | 0.30 | 0.04 | 33 |
| 1-8 | (Au, Pt, Mn) | (4, 46, 50) | 260 | 180 | 71 | 410 | 360 | 0.35 | 0.05 | 35 |
| 1-9 | (Pd, Pt, Mn) | (8, 43, 51) | 290 | 220 | 75 | 400 | 370 | 0.33 | 0.05 | 32 |
| 1-10 | (Ni, Pt, Mn) | (9, 43, 48) | 350 | 250 | 77 | 420 | 320 | 0.29 | 0.04 | 34 |
| 1-11 | (Ni, Pt, Mn) | (29, 20, 51) | 360 | 220 | 80 | 400 | 300 | 0.27 | 0.07 | 39 |
| 1-12 (Comp.) | (Ru, Rh, Mn) | (12, 10, 88) | 2200 | 260 | 90 | 410 | 180 | 0.09 | 0.18 | 68 |
| 1-13 (Comp.) | (Ru, Rh, Mn) | (1, 19, 80) | 2800 | 270 | 70 | 410 | 160 | 0.09 | 0.28 | 60 |
| 1-14 (Comp.) | (Ru, Rh, Mn) | (1, 19, 80) | 60000 | 290 | 85 | 430 | 190 | 0.02 | 0.45 | 82 |
| 1-15 (Comp.) | (Ru, Rh, Mn) | (12, 10, 88) | 2300 | 2500 | 1200 | 2800 | 150 | 0.08 | 0.30 | 80 |
| 1-16 (Comp.) | (Ru, Rh, Mn) | (15, 8, 87) | 3500 | 2800 | 1600 | 3200 | 140 | 0.06 | 0.33 | 113 |
| 1-17 (Comp.) | (Ru, Rh, Mn) | (12, 30, 58) | 3300 | 2900 | 1500 | 2600 | 100 | 0.03 | — | — |

Comp.: Comparative
Conc.: Concentration
—: Unmeasurable

From the experiment results shown in Table 1, when the concentration of oxygen contained in the antiferromagnetic layer as impurities is no more than 2,000 atomic ppm, the highly excellent exchange coupling energy J (for example, no less than 0.1 erg/cm$^2$) and the highly excellent blocking temperature Tb (for example, no less than 200° C.) can be obtained. It is seen that such an excellent characteristic can not be obtained no more than 100,000 ppm conventionally proposed, particularly around 60,000 ppm (Japanese First in the antiferromagnetic layer as impurities, upon the exchange coupling energy J (erg/cm$^2$) between the antiferromagnetic layer and the ferromagnetic layer and upon the blocking temperature Tb.

Various samples (samples Nos. 2-1 to 2-7) were prepared as shown in Table 2 by changing the carbon concentration, the sulfur concentration and the chlorine concentration in the antiferromagnetic layer in the sample No. 1-1 of Example 1.

With respect to these samples, evaluation similar to Example 1 was carried out. The results are shown in Table 2.

TABLE 2

| Sample No. | Antiferromagnetic Layer (m1, m2, m3) | (x1, y1, z1) | Oxygen Conc. (ppm) | Carbon Conc. (ppm) | Sulfer Conc. (ppm) | Chlorine Conc. (ppm) | Tb (° C.) | J (erg/cm$^2$) | Tb Dispersion Degree at 120° C. | Tb Dispersion Half-Value Width (° C.) |
|---|---|---|---|---|---|---|---|---|---|---|
| 1-1  | (Ru, Rh, Mn) | (8, 10, 82) | 520 | 280 | 89  | 480 | 245 | 0.22 | 0.09 | 55 |
| 2-1  | (Ru, Rh, Mn) | (8, 10, 82) | 520 | 160 | 60  | 320 | 270 | 0.25 | 0.09 | 50 |
| 2-2  | (Ru, Rh, Mn) | (8, 10, 82) | 520 | 210 | 85  | 420 | 250 | 0.24 | 0.08 | 45 |
| 2-3  | (Ru, Rh, Mn) | (8, 10, 82) | 520 | 320 | 90  | 530 | 230 | 0.21 | 0.07 | 40 |
| 2-4* | (Ru, Rh, Mn) | (8, 10, 82) | 520 | 430 | 120 | 610 | 170 | 0.08 | 0.12 | 85 |
| 2-5* | (Ru, Rh, Mn) | (8, 10, 82) | 520 | 650 | 180 | 700 | 140 | 0.05 | 0.19 | — |
| 2-6* | (Ru, Rh, Mn) | (8, 10, 82) | 520 | 550 | 150 | 620 | 150 | 0.06 | 0.15 | 110 |
| 2-7* | (Ru, Rh, Mn) | (8, 10, 82) | 520 | 460 | 160 | 490 | 180 | 0.09 | 0.13 | 90 |

—: Unmeasurable
*Sample in which the total concentration of carbon, sulfer, and chlorine in an antiferromagnetic layer exceeds 1000 ppm.

From the experiment results shown in Table 2, when the total concentration of carbon, sulfur and chlorine contained in the antiferromagnetic layer as impurities is no more than 1,000 atomic ppm, the highly excellent exchange coupling energy J (for example, no less than 0.1 erg/cm$^2$) and the highly excellent blocking temperature Tb (for example, no less than 200° C.) can be obtained.

Further, when the total concentration of carbon, sulfur and chlorine contained in the antiferromagnetic layer as impurities is no more than 1,000 atomic ppm (No. 1-1 and Nos. 2-1 to 2-3), the Tb dispersion degree at 120° C. is small to provide an excellent film wherein the partial magnetization reversal in the antiferromagnetic layer is quite small around this temperature. It is seen that the Tb dispersion degree half-value width is also small and the antiferromagnetic layer is formed of the grains having the highly uniform characteristics.

EXAMPLE 3

Experiments were carried out for examining influence of oxygen contained in the soft magnetic layer, being a free layer, as impurities.

Samples as shown in Table 3 were prepared. Specifically, each of the samples was prepared by forming and stacking, on a silicon substrate, a ground layer of Ta (10 nm in thickness), a Permalloy soft magnetic layer (NiFe; 10 nm in thickness), and an oxidation preventing layer of Ta (10 nm in thickness) in the order named using the sputtering method.

In preparing the samples, the sputtering conditions upon forming the Permalloy soft magnetic layers were changed. With respect to samples Nos. 3-1 to 3-6 of the present invention shown in Table 3, the ultimate pressure in the vacuum film forming apparatus was set to 8×10$^{-10}$ Torr, the oxygen concentrations of the targets were set to 50 atomic ppm, and the impurity concentration in the sputtering gas was set to 20 ppb where the H$_2$O concentration was set to 8 ppb. On the other hand, with respect to comparative samples Nos. 3-7 to 3-10 shown in Table 3, the ultimate pressure in the vacuum film forming apparatus was set to 3×10$^{-7}$ Torr, the oxygen concentrations of the targets were set to 5,800 ppm, and the impurity concentration in the sputtering gas was set to 300 ppb where the H$_2$O concentration was set to 170 ppb.

With respect to each of the samples, the concentration of impurities contained in the soft magnetic layer, the coercive force Hc, the unidirectional anisotropic magnetic field Hk, the skew angle dispersion S$_{kew}$ of the soft magnetic layer and the structure factor S of the soft magnetic layer were examined.

Impurity Concentration in Soft Magnetic Layer

Experiments were carried out according to a method similar to that of the impurity concentration of the antiferromagnetic layer.

Hc and Hk

The measurement was carried out using the vibration sample type magnetometer (VSM). With respect to Hc, a smaller value is better. On the other hand, it is a feature of the soft material that Hk falls within a range of certain values.

Skew Angle Dispersion Skew and Structure Factor S of Soft Magnetic Layer

Evaluation was carried out using the dynamic differential magnetization rate measuring device. This device applies the laser beam to the sample and, based on its Kerr rotation angle change, analyzes the microscopic magnetization fluctuation. The skew angle represents the microscopic magnetization fluctuation and can be said to be better as it is smaller, representing more uniform characteristics. The structure factor S is a parameter indicative of microscopic homogeneity, and is better as it is smaller.

The results are shown in Table 3.

TABLE 3

| Sample No. | Oxygen Conc. (ppm) | Carbon Conc. (ppm) | Sulfer Conc. (ppm) | Chlorine Conc. (ppm) | Hc (Oe) | Hk (Oe) | Skew (deg) | S (×10$^{-3}$ erg/cm$^2$) |
|---|---|---|---|---|---|---|---|---|
| 3-1 | 180 | 20 | 15 | 150 | 0.8 | 3.4 | 0.5 | 10.6 |
| 3-2 | 250 | 30 | 20 | 300 | 1.0 | 3.6 | 0.7 | 12.3 |

TABLE 3-continued

| Sample No. | Oxygen Conc. (ppm) | Carbon Conc. (ppm) | Sulfer Conc. (ppm) | Chlorine Conc. (ppm) | Hc (Oe) | Hk (Oe) | Skew (deg) | S (×10⁻³ erg/cm²) |
|---|---|---|---|---|---|---|---|---|
| 3-3 | 200 | 25 | 20 | 200 | 0.9 | 3.3 | 0.6 | 11.9 |
| 3-4 | 170 | 35 | 15 | 130 | 0.9 | 3.4 | 0.6 | 12.0 |
| 3-5 | 80 | 20 | 15 | 105 | 0.8 | 3.1 | 0.4 | 11.2 |
| 3-6 | 600 | 20 | 10 | 100 | 1.2 | 4.0 | 1.6 | 24.3 |
| 3-7 (Comp.) | 1000 | 115 | 65 | 550 | 1.5 | 4.3 | 2.5 | 32.5 |
| 3-8 (Comp.) | 2100 | 80 | 50 | 500 | 1.7 | 4.5 | 5.3 | 42.3 |
| 3-9 (Comp.) | 2300 | 100 | 60 | 550 | 1.9 | 4.7 | 7.4 | 48.0 |
| 3-10 (Comp.) | 2800 | 120 | 80 | 600 | 2.5 | 6.0 | 9.2 | 62.0 |

From the experiment results shown in Table 3, it is seen that, when the concentration of oxygen contained in the soft magnetic layer as impurities is no more than 800 atomic ppm, the highly excellent Hc and Hk can be obtained.

Further, when the oxygen concentration of the soft magnetic layer is no more than 800 atomic ppm, it is seen that the values of the skew angle dispersion $S_{kew}$ and the structure factor S of the soft magnetic layer are both very small so that the highly excellent soft film having the uniform characteristic and the homogeneity is formed.

EXAMPLE 4

Experiments were carried out for examining influence of the concentrations of carbon, sulfur and chlorine contained in the soft magnetic layer as impurities, upon the film quality.

Various samples (samples Nos. 4-1 to 4-5) were prepared as shown in Table 4 by changing the carbon concentration, the sulfur concentration and the chlorine concentration in the soft magnetic layer in the sample No. 3-1 of Example 3.

With respect to these samples, evaluation similar to Example 3 was carried out. The results are shown in Table 4.

TABLE 4

| Sample No. | Oxygen Conc. (ppm) | Carbon Conc. (ppm) | Sulfer Conc. (ppm) | Chlorine Conc. (ppm) | Hc (Oe) | Hk (Oe) | Skew (deg) | S (×10⁻³ erg/cm²) |
|---|---|---|---|---|---|---|---|---|
| 3-1 | 180 | 20 | 15 | 150 | 0.8 | 3.4 | 0.5 | 10.6 |
| 4-1 | 180 | 35 | 20 | 140 | 0.6 | 3.6 | 0.2 | 10.1 |
| 4-2 | 180 | 15 | 20 | 120 | 0.7 | 3.5 | 0.3 | 11.2 |
| 4-3 | 180 | 40 | 30 | 160 | 0.8 | 4.1 | 0.7 | 12.5 |
| 4-4* | 180 | 180 | 150 | 240 | 1.5 | 4.0 | 2.3 | 25.1 |
| 4-5* | 180 | 350 | 230 | 300 | 3.2 | 3.2 | 5.1 | 48.9 |

*Sample in which the total concentration of carbon, sulfer, and chlorine in a soft magnetic layer exceeds 500 ppm.

From the experiment results shown in Table 4, it is seen that, when the total concentration of carbon, sulfur and chlorine contained in the soft magnetic layer as impurities is no more than 500 atomic ppm (samples Nos. 4-1 to 4-3), the highly excellent Hc and Hk can be obtained.

Further, when the total concentration of the carbon sulfur and chlorine contained in the soft magnetic layer as impurities is no more than 500 atomic ppm (samples Nos. 4-1 to 4-3), it is seen that the values of the skew angle dispersion Skew and the structure factor S of the soft magnetic layer are both very small so that the highly excellent soft film having the uniform characteristic and the homogeneity is formed.

EXAMPLE 5

A spin valve (SV) type magnetoresistance effect type head was prepared as shown in FIG. 11.

First, a spin valve type magnetoresistance effect film was prepared. Specifically, the film sample was prepared by stacking, on a substrate 5 (AlTiC with $Al_2O_3$), a ground layer 7 (Ta; 5 nm in thickness), a soft magnetic layer 20 (NiFe; 7 nm in thickness), a non-magnetic metal layer 30 (Cu; 2.5 nm in thickness), a ferromagnetic layer 40 (Co; 3 nm in thickness), an antiferromagnetic layer 50 ($Ru_3Rh_{15}Mn_{82}$; 10 nm in thickness) and a protective layer 80 (Ta; 5 nm in thickness) in the order named, so as to prepare the magnetoresistance effect type head.

The impurity concentrations of the antiferromagnetic layer 50 were such that the oxygen concentration: 280 ppm, the carbon concentration: 210 ppm, the sulfur concentration: 78 ppm and the chlorine concentration: 390 ppm. On the other hand, the impurity concentrations of the soft magnetic layer 20 were such that the oxygen concentration: 120 ppm, the carbon concentration: 35 ppm, the sulfur concentration: 20 ppm and the chlorine concentration: 150 ppm.

In this magnetoresistance effect type head, an upper shield layer and a lower shield layer were formed via an $Al_2O_3$ gap film.

In this magnetoresistance effect type head, an inductive head portion as shown in FIG. 11 was formed. Specifically, NiFe was formed to have a thickness of 10 nm as linking soft magnetic layers 520, and then, $Ru_5Rh_{15}Mn_{20}$ was formed on the linking soft magnetic layers 520 to have a thickness of 10 nm as antiferromagnetic layers 800. Thereafter, electrode portions 100 made of Ta were further formed on the antiferromagnetic layers 800 so that the spin valve (SV) type magnetoresistance effect type head was prepared as shown in FIG. 11. Subsequently, in vacuum of $10^{-7}$ Torr, the head was cooled from 200° C. while applying a magnetic field of 2000 e in an in-plane direction perpendicular to a measurement current direction, so as to induce the pinning effect for the ferromagnetic layer. A track width of the magnetoresistance effect type head was set to 2 μm, while a height of the MR element was set to 1 μm and a sense current was set to 4 mA.

A relationship between the applied magnetic field and the output voltage was examined using the magnetoresistance effect type head, and the output voltage of 3.6 mV was confirmed. This is a very large value which is about twice the normal spin valve head.

EXAMPLE 6

Figure 12:
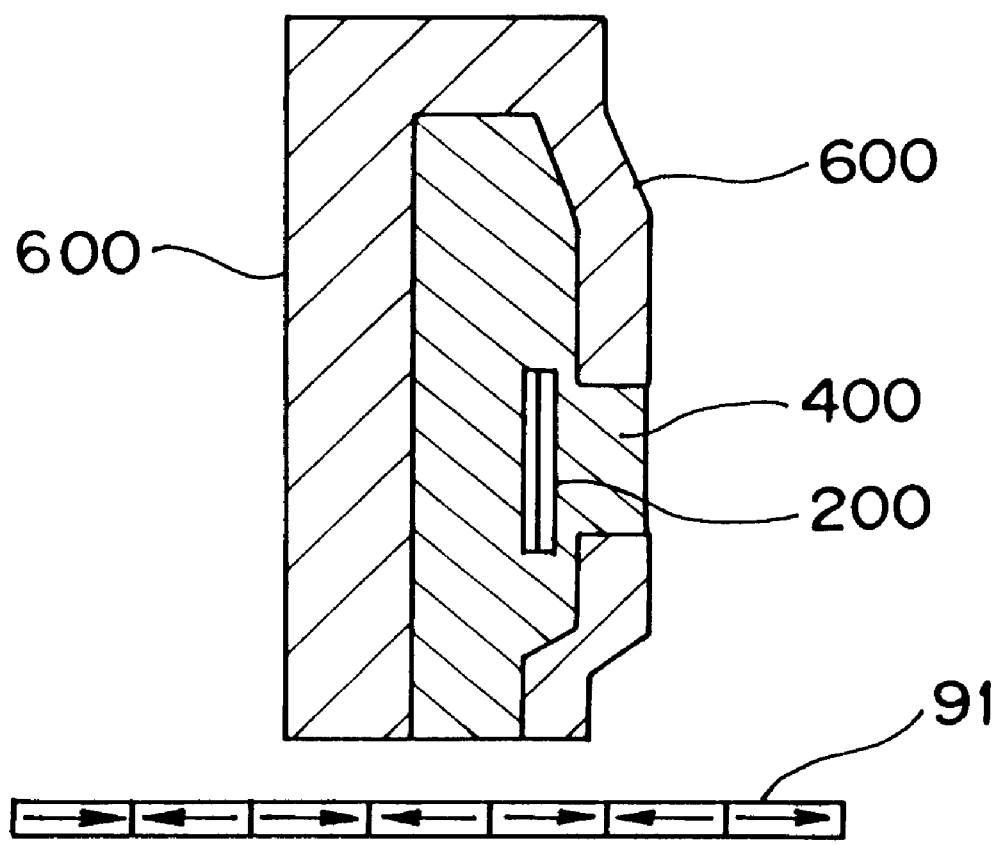
FIG. 12 is a partially omitted sectional view showing an example, wherein a magnetoresistance effect film (magnetic multilayered film) according to the present invention is applied to a yoke-type MR head.

FIG. 12 shows an example in which the magnetoresistance effect film of the present invention is applied to a yoke-type MR head. In this example, a cutout is formed at a portion of yokes 600, 600, and a magnetoresistance effect film 200 is formed therebetween via a thin insulation film 400. The magnetoresistance effect film 200 is provided with electrodes (not shown) for feeding a current in a direction parallel to or perpendicular to a magnetic path formed by the yokes 600, 600.

EXAMPLE 7

Figure 13:
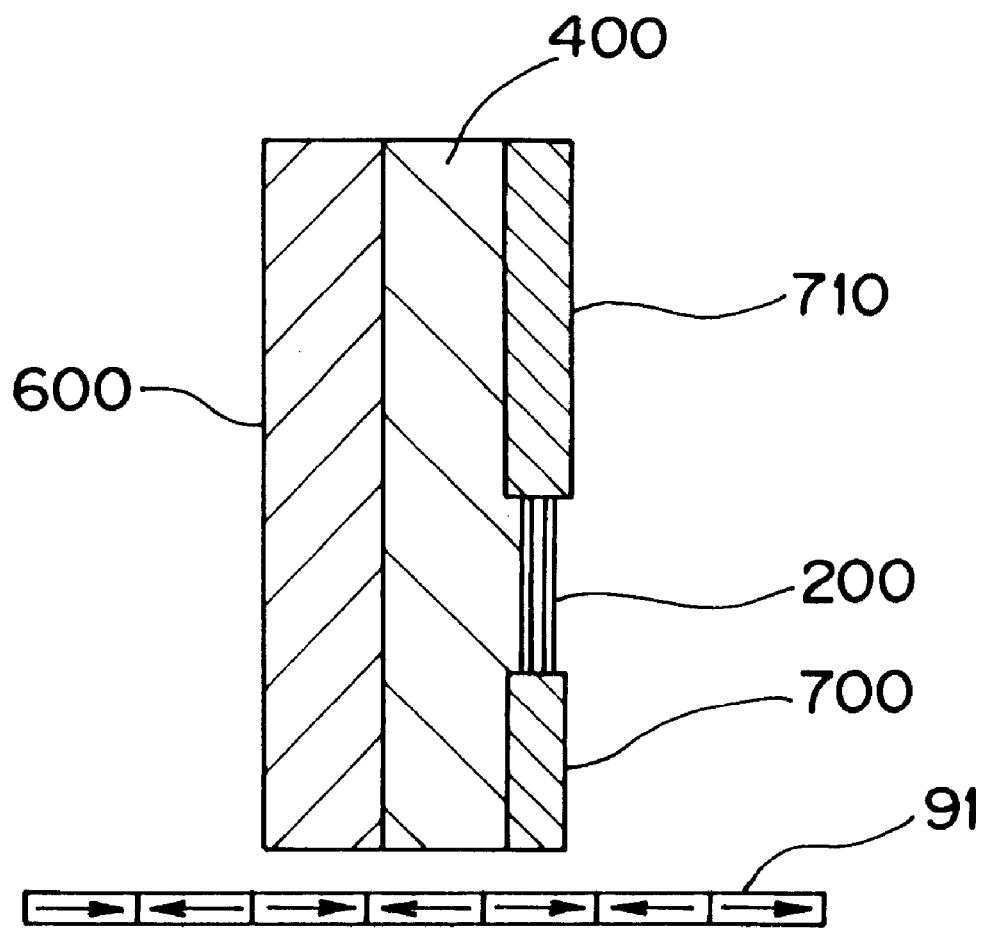
FIG. 13 is a partially omitted sectional view showing an example, wherein a magnetoresistance effect film (magnetic multilayered film) according to the present invention is applied to a flux guide type MR head.

FIG. 13 shows an example in which the magnetoresistance effect film of the present invention is applied to a flux guide type MR head. In this example, a magnetoresistance effect film 200 is magnetically coupled to flux guide layers 700 and 710 of high resistivity and high permeability. The flux guide layers 700 and 710 indirectly conduct a signal magnetic field to the magnetoresistance effect film 200. Further, via a non-magnetic insulation layer 400, a flux back guide layer 600 (escape path for magnetic flux passing the magnetoresistance effect film 200) is formed. Flux back guide layers 600 may be provided at both sides the magnetoresistance effect film 200 via the non-magnetic insulation layer 400. A feature of this head resides in that a magnetic field detecting portion thereof can approximate a recording medium in a nearly abutting fashion so that the high output can be obtained.

As appreciated from the foregoing results, according to the preferred embodiments of the present invention, since the impurities contained in the antiferromagnetic layer are regulated, there can be provided the magnetoresistance effect film having the high-quality antiferromagnetic layer which is excellent in thermal stability, sufficiently high in blocking temperature and highly excellent in pinning effect. Further, there can be provided the magnetoresistance effect type head which is excellent in thermal stability, high in magnetic field sensitivity and large in MR change ratio. Moreover, since the impurities contained in the soft magnetic layer are regulated, there can be provided the magnetoresistance effect film as well as the magnetoresistance effect type head which are excellent in soft magnetic property and high in magnetic field sensitivity.

What is claimed is:

1. A spin valve magnetoresistance effect film comprising a magnetic multilayered film including a non-magnetic metal layer, a ferromagnetic layer formed on one surface of the non-magnetic metal layer, a soft magnetic layer formed on the other surface of said non-magnetic metal layer, and an antiferromagnetic layer which is formed on a surface of said ferromagnetic layer remote from a surface thereof abutting said non-magnetic metal layer so as to pin a direction of magnetization of said ferromagnetic layer is made of $M_xMn_{100-x}$ where M represents a member selected from the group consisting of Ru, Rh, Re, Pt, Pd, Au, Ag, Fe, Ni and Cr, $15 \leq x \leq 58$, and the unit of x is atomic % or said antiferromagnetic layer is made of $M^1_p M^2_q Mn_r$ where each of $M^1$ and $M^2$ represents a member selected from the group consisting of Ru, Rh, Re, Pt, Pd. Au, Ag, Fe, Ni and Cr. $1 \leq p < 54, 1 \leq q \leq 54, 45 \leq r \leq 85, 15 \leq p+q \leq 55$, and the unit of p, q and r is atomic %, wherein said antiferromagnetic layer contains oxygen as impurities and a concentration of oxygen contained in said antiferromagnetic layer is set to 1 to 2,000 atomic ppm, said antiferromagnetic layer further contains at least one member selected from the group consisting of carbon, sulfur and chlorine as impurities, and the total concentration of the impurities including at least said one of carbon, sulfur and chlorine is set to 1 to 1,000 atomic ppm.

2. The magnetoresistance effect film according to claim 1, wherein said antiferromagnetic layer further contains carbon, sulfur and chlorine as impurities, and the total concentration of carbon, sulfur and chlorine contained in said antiferromagnetic layer is set to 1 to 1,000 atomic ppm.

3. The magnetoresistance effect film according to claim 1, wherein a half-value width of a blocking temperature distribution curve of said magnetic multilayered film is set to no more than 80° C., and a blocking temperature dispersion degree of said magnetic multilayered film at 120° C. is set to no more than 0.10.

4. The magnetoresistance effect film according to claim 1, wherein a blocking temperature of said magnetic multilayered film is set to no less than 200° C.

5. The magnetoresistance effect film according to claim 1, wherein an exchange coupling energy between said antiferromagnetic layer and said ferromagnetic layer is set to no less than $0.10$ erg/cm$^2$.

6. The magnetoresistance effect film according to claim 1, wherein said antiferromagnetic layer is formed by a sputtering method in a vacuum film forming apparatus degassed to an ultimate pressure of no more than $2 \times 10^{-9}$ Torr and under an atmosphere of sputtering gas introduced upon film formation, using a target of an oxygen concentration of no more than 600 ppm, and wherein the total concentration of impurities in the sputtering gas is set to no more than 100 ppb and a concentration of H$_2$O in the sputtering gas is set to no more than 40 ppb.

7. A spin valve magnetoresistance effect film comprising a magnetic multilayered film including a non-magnetic metal layer, a ferromagnetic layer formed on one surface of the non-magnetic metal layer, a soft magnetic layer formed on the other surface of said non-magnetic metal layer, and an antiferromagnetic layer which is formed on a surface of said ferromagnetic layer remote from a surface thereof abutting said non-magnetic metal layer so as to pin a direction of magnetization of said ferromagnetic layer is made of $M_xMn_{100-x}$ where M represents a member selected from the group consisting of Ru, Rh, Re, Pt, Pd, Au, Ag, Fe, Ni and Cr, $15 \leq x \leq 58$, and the unit of x is atomic % or said antiferromagnetic layer is made of $M^1_p M^2_q Mn_r$ where each of $M^1$ and $M^2$ represents a member selected from the group consisting of Ru, Rh, Re, Pt, Pd. Au, Ag, Fe, Ni and Cr, $1 \leq p \leq 54, 1 \leq q \leq 54, 45 \leq r \leq 85, 15 \leq p+q \leq 55$, and the unit of p, q and r is atomic %, wherein said antiferromagnetic layer contains oxygen as impurities and a concentration of oxygen contained in said antiferromagnetic layer is set to 1 to 2,000 atomic ppm, said antiferromagnetic layer further contains at least one member selected from the group consisting of carbon, sulfur and chlorine as impurities, and the total concentration of the impurities including at least said one of carbon, sulfur and chlorine is set to 1 to 1,000 atomic ppm, and wherein said soft magnetic layer contains oxygen as impurities and a concentration of oxygen contained in said soft magnetic layer is set to 1 to 800 atomic ppm.

8. The magnetoresistance effect film according to claim 7, wherein said antiferromagnetic layer further contains at least one selected from carbon, sulfur and chlorine as impurities, and the total concentration of the impurities including at least said one of carbon, sulfur and chlorine is set to 1 to 1,000 atomic ppm, and wherein said soft magnetic layer further contains at least one selected from carbon, sulfur and chlorine as impurities, and the total concentration of the impurities including at least said one of carbon, sulfur and chlorine contained in said soft magnetic layer is set to 1 to 500 atomic ppm.

9. The magnetoresistance effect film according to claim 7, wherein said antiferromagnetic layer further contains carbon, sulfur and chlorine as impurities, and the total concentration of carbon, sulfur and chlorine contained in said antiferromagnetic layer is set to 1 to 1,000 atomic ppm, and wherein said soft magnetic layer further contains carbon, sulfur and chlorine as impurities, and the total concentration of carbon, sulfur and chlorine contained in said soft magnetic layer is set to 1 to 500 atomic ppm.

10. The magnetoresistance effect film according to claim 7, wherein a half-value width of a blocking temperature distribution curve of said magnetic multilayered film is set to no more than 80° C., and a blocking temperature dispersion degree of said magnetic multilayered film at 120° C. is set to no more than 0.10.

11. The magnetoresistance effect film according to claim 7, wherein a blocking temperature of said magnetic multilayered film is set to no less than 200° C.

12. The magnetoresistance effect film according to claim 7, wherein an exchange coupling energy between said antiferromagnetic layer and said ferromagnetic layer is set to no less than 0.10 erg/cm$^2$.

13. The magnetoresistance effect film according to claim 7, wherein a structure factor of the soft magnetic layer of said magnetic multilayered film is set to no more than $30 \times 10^{-3}$ erg/cm$^2$, and a skew angle dispersion of said soft magnetic layer is set to no more than 2 deg.

14. The magnetoresistance effect film according to claim 7, wherein said soft magnetic layer is formed by a sputtering method in a vacuum film forming apparatus degassed to an ultimate pressure of no more than $2 \times 10^{-9}$ Torr and under an atmosphere of sputtering gas introduced upon film formation, using a target of an oxygen concentration of no more than 100 ppm, and wherein the total concentration of impurities in the sputtering gas is set to no more than 100 ppb and a concentration of H$_2$O in the sputtering gas is set to no more than 40 ppb.

15. A magnetoresistance effect head comprising a magnetoresistance effect film, conductive films and electrode portions, wherein said conductive films are conductively connected to said magnetoresistance effect film through said electrode portions, and said magnetoresistance effect film is a spin valve magnetoresistance effect film is a spin valve magnetoresistance effect film which comprises a magnetic multilayered film including a non-magnetic metal layer, a ferromagnetic layer formed on one surface of the non-magnetic metal layer, a soft magnetic layer formed on the other surface of said non-magnetic metal layer, and an antiferromagnetic layer which is formed on a surface of said ferromagnetic layer remote from a surface thereof abutting said non-magnetic metal layer so as to pin a direction of magnetization of said ferromagnetic layer is made of M$_x$Mn$_{100-x}$ where M represents a member selected from the group consisting of Ru, Rh, Re, Pt, Pd, Au, Ag, Fe, Ni and Cr, $15 \leq x \leq 58$, and the unit of x is atomic % or said antiferromagnetic layer is made of M$^1_p$M$^2_q$Mn$_r$ where each of M$^1$ and M$^2$ represents a member selected from the group consisting of Ru, Rh, Re, Pt, Pd, Au, Ag, Fe, Ni and Cr, $1 \leq p \leq 54$, $1 \leq q \leq 54$, $45 \leq r \leq 85$, $15 \leq p+q \leq 55$, and the unit of p, q and r is atomic %, and wherein said antiferromagnetic layer contains oxygen as impurities and a concentration of oxygen contained in said antiferromagnetic layer is set to 1 to 2,000 atomic ppm, said antiferromagnetic layer further contains at least one member selected from the group consisting of carbon, sulfur and chlorine as impurities, and the total concentration of the impurities including at least said one of carbon, sulfur and chlorine is set to 1 to 1000 atomic ppm.

16. The magnetoresistance effect head according to claim 15, wherein said antiferromagnetic layer further contains carbon, sulfur and chlorine as impurities, and the total concentration of carbon, sulfur and chlorine contained in said antiferromagnetic layer is set to 1 to 1,000 atomic ppm.

17. The magnetoresistance effect head according to claim 15, wherein a half-value width of a blocking temperature distribution curve of said magnetic multilayered film is set to no more than 80° C., and a blocking temperature dispersion degree of said magnetic multilayered film at 120° C. is set to no more than 0.10.

18. The magnetoresistance effect head according to claim 15, wherein a blocking temperature of said magnetic multilayered film is set to no less than 200° C.

19. The magnetoresistance effect head according to claim 15, wherein an exchange coupling energy between said antiferromagnetic layer and said ferromagnetic layer is set to no less than 0.10 erg/cm$^2$.

20. A magnetoresistance effect head comprising a magnetoresistance effect film, conductive films and electrode portions, wherein said conductive films are conductively connected to said magnetoresistance effect film through said electrode portions, and said magnetoresistance effect film is a spin valve type magnetoresistance effect film which comprises a magnetic multilayered film including a non-magnetic metal layer, a ferromagnetic layer formed on one surface of the non-magnetic metal layer, a soft magnetic layer formed on the other surface of said non-magnetic metal layer, and an antiferromagnetic layer which is formed on a surface of said ferromagnetic layer remote from a surface thereof abutting said non-magnetic metal layer so as to pin a direction of magnetization of said ferromagnetic layer is made of M$_x$Mn$_{100-x}$ where M represents a member selected from the group consisting of Ru, Rh, Re, Pt, Pd, Au, Ag, Fe, Ni and Cr, $15 \leq x \leq 58$, and the unit of x is atomic % or said anti ferromagnetic layer is made of M$^1_p$M$^2_q$Mn$_r$ where each of M$^1$ and M$^2$ represents a member selected from the group consisting of Ru, Rh, Re, Pt, Pd, Au, Ag, Fe, Ni and Cr, $1 \leq p \leq 54$, $1 \leq q \leq 54$, $45 \leq r \leq 85$, $15 \leq p+q \leq 55$, and the unit of p, q and r is atomic %, wherein said antiferromagnetic layer contains oxygen as impurities and a concentration of oxygen contained in said antiferromagnetic layer i set to 1 to 2,000 atomic ppm said antiferromagnetic layer further contains at least one member selected from the group consisting of carbon, sulfur and chlorine as impurities, and the total concentration of the impurities including at least said one of carbon, sulfur and chlorine is set to 1 to 1,000 atomic ppm, and wherein said soft magnetic layer contains oxygen as impurities and a concentration of oxygen contained in said soft magnetic layer is set to 1 to 800 atomic ppm.

21. The magnetoresistance effect head according to claim 20, wherein said antiferromagnetic layer further contains carbon, sulfur and chlorine as impurities, and the total concentration of carbon, sulfur and chlorine contained in said antiferromagnetic layer is set to 1 to 1,000 atomic ppm, and wherein said soft magnetic layer further contains carbon, sulfur and chlorine as impurities, and the total concentration of carbon, sulfur and chlorine contained in said soft magnetic layer is set to 1 to 500 atomic ppm.

22. The magnetoresistance effect head according to claim 20, wherein a half-value width of a blocking temperature distribution curve of said magnetic multilayered film is set to no more than 80° C., and a blocking temperature dispersion degree of said magnetic multilayered film at 120° C. is set to no more than 0.10.

23. The magnetoresistance effect head according to claim 20, wherein a blocking temperature of said magnetic multilayered film is set to no less than 200° C.

24. The magnetoresistance effect head according to claim 20, wherein an exchange coupling energy between said antiferromagnetic layer and said ferromagnetic layer is set to no less than 0.10 erg/cm$^2$.

25. The magnetoresistance effect head according to claim 20, wherein a structure factor of the soft magnetic layer of said magnetic multilayered film is set to no more than $30 \times 10^{-3}$ erg/cm$^2$, and a skew angle dispersion of said soft magnetic layer is set to no more than 2 deg.

* * * * *